US008661392B2

(12) United States Patent  
Quandt et al.

(10) Patent No.: US 8,661,392 B2
(45) Date of Patent: Feb. 25, 2014

(54) METHODS FOR CELL BOUNDARY ENCROACHMENT AND LAYOUTS IMPLEMENTING THE SAME

(75) Inventors: Jonathan R. Quandt, San Jose, CA (US); Scott T. Becker, Scotts Valley, CA (US); Dhrumil Gandhi, Cupertino, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 401 days.

(21) Appl. No.: 12/904,134

(22) Filed: Oct. 13, 2010

(65) Prior Publication Data

US 2011/0084312 A1    Apr. 14, 2011

Related U.S. Application Data

(60) Provisional application No. 61/251,279, filed on Oct. 13, 2009.

(51) Int. Cl.
*G06F 17/50* (2006.01)

(52) U.S. Cl.
USPC ............................ 716/122; 716/119; 716/135

(58) Field of Classification Search
USPC ........................................ 716/119, 122, 135
See application file for complete search history.

(56) References Cited

U.S. PATENT DOCUMENTS

| 4,197,555 | A | 4/1980 | Uehara et al. |
| 4,417,161 | A | 11/1983 | Uya |
| 4,424,460 | A | 1/1984 | Best |
| 4,613,940 | A | 9/1986 | Shenton et al. |
| 4,657,628 | A | 4/1987 | Holloway et al. |
| 4,682,202 | A | 7/1987 | Tanizawa |
| 4,745,084 | A | 5/1988 | Rowson et al. |
| 4,780,753 | A | 10/1988 | Shinichi et al. |
| 4,801,986 | A | 1/1989 | Chang et al. |
| 4,804,636 | A | 2/1989 | Groover, III |
| 4,812,688 | A | 3/1989 | Chu et al. |

(Continued)

FOREIGN PATENT DOCUMENTS

| EP | 0102644 | 7/1989 |
| EP | 0788166 | 8/1997 |

(Continued)

OTHER PUBLICATIONS

U.S. Appl. No. 60/625,342, filed May 25, 2006, Pileggi et al.

(Continued)

*Primary Examiner* — Naum Levin
(74) *Attorney, Agent, or Firm* — Martine Penilla Group, LLP

(57) ABSTRACT

A semiconductor device is disclosed to include a plurality of cells. Each of the cells has a respective outer cell boundary defined to circumscribe the cell in an orthogonal manner. Also, each of the cells includes circuitry for performing one or more logic functions. This circuitry includes a plurality of conductive features defined in one or more levels of the cell. One or more of the conductive features in at least one level of a given cell is an encroaching feature positioned to encroach by an encroachment distance into an exclusion zone. The exclusion zone occupies an area within the cell defined by an exclusion distance extending perpendicularly inward into the given cell from a first segment of the outer cell boundary. The exclusion distance is based on a design rule distance representing a minimum separation distance required between conductive features in adjacently placed cells on the semiconductor device.

17 Claims, 17 Drawing Sheets

(56) References Cited

U.S. PATENT DOCUMENTS

| | | |
|---|---|---|
| 4,884,115 A | 11/1989 | Michel et al. |
| 4,928,160 A | 5/1990 | Crafts |
| 4,975,756 A | 12/1990 | Haken et al. |
| 5,068,603 A | 11/1991 | Mahoney |
| 5,079,614 A | 1/1992 | Khatakhotan |
| 5,097,422 A | 3/1992 | Corbin et al. |
| 5,117,277 A * | 5/1992 | Yuyama et al. ............... 257/210 |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A * | 7/1996 | Ali ................................ 257/204 |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A | 3/2000 | Kumagai |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. |
| 6,331,791 B1 | 12/2001 | Huang |
| 6,335,250 B1 | 1/2002 | Egi |
| 6,338,972 B1 | 1/2002 | Sudhindranath et al. |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,400,183 B2 | 6/2002 | Yamashita et al. |
| 6,415,421 B2 | 7/2002 | Anderson et al. |
| 6,416,907 B1 | 7/2002 | Winder et al. |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. |
| 6,477,695 B1 | 11/2002 | Gandhi |
| 6,480,032 B1 | 11/2002 | Aksamit |
| 6,480,989 B2 | 11/2002 | Chan et al. |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |
| 6,505,327 B2 | 1/2003 | Lin |
| 6,505,328 B1 | 1/2003 | van Ginneken et al. |
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. |
| 6,536,028 B1 | 3/2003 | Katsioulas et al. |

(56) References Cited

U.S. PATENT DOCUMENTS

| | | |
|---|---|---|
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi |
| 6,571,379 B2 | 5/2003 | Takayama |
| 6,578,190 B2 | 6/2003 | Ferguson et al. |
| 6,588,005 B1 | 7/2003 | Kobayashi et al. |
| 6,590,289 B2 | 7/2003 | Shively |
| 6,591,207 B2 | 7/2003 | Naya et al. |
| 6,609,235 B2 | 8/2003 | Ramaswamy et al. |
| 6,610,607 B1 | 8/2003 | Armbrust et al. |
| 6,617,621 B1 | 9/2003 | Gheewala et al. |
| 6,620,561 B2 | 9/2003 | Winder et al. |
| 6,633,182 B2 | 10/2003 | Pileggi et al. |
| 6,635,935 B2 | 10/2003 | Makino |
| 6,642,744 B2 | 11/2003 | Or-Bach et al. |
| 6,643,831 B2 | 11/2003 | Chang et al. |
| 6,650,014 B2 | 11/2003 | Kariyazaki |
| 6,661,041 B2 | 12/2003 | Keeth |
| 6,662,350 B2 | 12/2003 | Fried et al. |
| 6,664,587 B2 | 12/2003 | Guterman et al. |
| 6,673,638 B1 | 1/2004 | Bendik et al. |
| 6,677,649 B2 | 1/2004 | Minami et al. |
| 6,687,895 B2 | 2/2004 | Zhang |
| 6,691,297 B1 | 2/2004 | Misaka et al. |
| 6,700,405 B1 | 3/2004 | Hirairi |
| 6,703,170 B1 | 3/2004 | Pindo |
| 6,709,880 B2 * | 3/2004 | Yamamoto et al. ............. 438/22 |
| 6,714,903 B1 | 3/2004 | Chu et al. |
| 6,732,338 B2 | 5/2004 | Crouse et al. |
| 6,732,344 B2 | 5/2004 | Sakamoto et al. |
| 6,737,199 B1 | 5/2004 | Hsieh |
| 6,737,318 B2 | 5/2004 | Murata et al. |
| 6,737,347 B1 | 5/2004 | Houston et al. |
| 6,745,372 B2 | 6/2004 | Cote et al. |
| 6,745,380 B2 | 6/2004 | Bodendorf et al. |
| 6,749,972 B2 | 6/2004 | Yu |
| 6,750,555 B2 | 6/2004 | Satomi et al. |
| 6,760,269 B2 | 7/2004 | Nakase et al. |
| 6,765,245 B2 | 7/2004 | Bansal |
| 6,777,138 B2 | 8/2004 | Pierrat et al. |
| 6,777,146 B1 | 8/2004 | Samuels |
| 6,787,823 B2 | 9/2004 | Shibutani |
| 6,789,244 B1 | 9/2004 | Dasasathyan et al. |
| 6,789,246 B1 | 9/2004 | Mohan et al. |
| 6,792,591 B2 | 9/2004 | Shi et al. |
| 6,792,593 B2 | 9/2004 | Takashima et al. |
| 6,794,677 B2 | 9/2004 | Tamaki et al. |
| 6,794,914 B2 | 9/2004 | Sani et al. |
| 6,795,332 B2 | 9/2004 | Yamaoka et al. |
| 6,795,358 B2 | 9/2004 | Tanaka et al. |
| 6,795,952 B1 | 9/2004 | Stine et al. |
| 6,795,953 B2 | 9/2004 | Bakarian et al. |
| 6,800,883 B2 | 10/2004 | Furuya et al. |
| 6,807,663 B2 | 10/2004 | Cote et al. |
| 6,809,399 B2 | 10/2004 | Ikeda et al. |
| 6,812,574 B2 | 11/2004 | Tomita et al. |
| 6,818,389 B2 | 11/2004 | Fritze et al. |
| 6,818,929 B2 | 11/2004 | Tsutsumi et al. |
| 6,819,136 B2 | 11/2004 | Or-Bach |
| 6,826,738 B2 | 11/2004 | Cadouri |
| 6,834,375 B1 | 12/2004 | Stine et al. |
| 6,841,880 B2 | 1/2005 | Matsumoto et al. |
| 6,850,854 B2 | 2/2005 | Naya et al. |
| 6,854,096 B2 | 2/2005 | Eaton et al. |
| 6,854,100 B1 | 2/2005 | Chuang et al. |
| 6,871,338 B2 | 3/2005 | Yamauchi |
| 6,872,990 B1 | 3/2005 | Kang |
| 6,877,144 B1 | 4/2005 | Rittman et al. |
| 6,881,523 B2 | 4/2005 | Smith |
| 6,884,712 B2 | 4/2005 | Yelehanka et al. |
| 6,885,045 B2 | 4/2005 | Hidaka |
| 6,889,370 B1 | 5/2005 | Kerzman et al. |
| 6,897,517 B2 | 5/2005 | Houdt et al. |
| 6,897,536 B2 | 5/2005 | Nomura et al. |
| 6,898,770 B2 | 5/2005 | Boluki et al. |
| 6,904,582 B1 | 6/2005 | Rittman et al. |
| 6,918,104 B2 | 7/2005 | Pierrat et al. |
| 6,920,079 B2 | 7/2005 | Shibayama |
| 6,921,982 B2 | 7/2005 | Joshi et al. |
| 6,922,354 B2 | 7/2005 | Ishikura et al. |
| 6,924,560 B2 | 8/2005 | Wang et al. |
| 6,928,635 B2 | 8/2005 | Pramanik et al. |
| 6,931,617 B2 | 8/2005 | Sanie et al. |
| 6,953,956 B2 | 10/2005 | Or-Bach et al. |
| 6,954,918 B2 | 10/2005 | Houston |
| 6,957,402 B2 | 10/2005 | Templeton et al. |
| 6,968,527 B2 | 11/2005 | Pierrat |
| 6,974,978 B1 | 12/2005 | Possley |
| 6,977,856 B2 | 12/2005 | Tanaka et al. |
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park |
| 6,992,925 B2 | 1/2006 | Peng |
| 6,993,741 B2 | 1/2006 | Liebmann et al. |
| 6,994,939 B1 | 2/2006 | Ghandehari et al. |
| 7,003,068 B2 | 2/2006 | Kushner et al. |
| 7,009,862 B2 | 3/2006 | Higeta et al. |
| 7,016,214 B2 | 3/2006 | Kawamata |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,264,990 B2 | 9/2007 | Rueckes et al. |
| 7,269,803 B2 * | 9/2007 | Khakzadi et al. ............. 716/120 |
| 7,278,118 B2 | 10/2007 | Pileggi et al. |

(56) References Cited

U.S. PATENT DOCUMENTS

| | | |
|---|---|---|
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,500,211 B2 | 3/2009 | Komaki |
| 7,502,275 B2 | 3/2009 | Nii et al. |
| 7,503,026 B2 * | 3/2009 | Ichiryu et al. .................. 716/130 |
| 7,504,184 B2 | 3/2009 | Hung et al. |
| 7,506,300 B2 | 3/2009 | Sezginer et al. |
| 7,508,238 B2 | 3/2009 | Yamagami |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Lee et al. |
| 7,568,174 B2 | 7/2009 | Sezginer et al. |
| 7,569,309 B2 | 8/2009 | Walter et al. |
| 7,569,310 B2 | 8/2009 | Wallace et al. |
| 7,569,894 B2 | 8/2009 | Suzuki |
| 7,575,973 B2 | 8/2009 | Mokhlesi et al. |
| 7,598,541 B2 | 10/2009 | Okamoto et al. |
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |
| 7,739,627 B2 * | 6/2010 | Chew et al. .................. 716/132 |
| 7,749,662 B2 | 7/2010 | Matthew et al. |
| 7,755,110 B2 | 7/2010 | Gliese et al. |
| 7,770,144 B2 | 8/2010 | Dellinger |
| 7,791,109 B2 | 9/2010 | Wann et al. |
| 7,802,219 B2 | 9/2010 | Tomar et al. |
| 7,825,437 B2 | 11/2010 | Pillarisetty et al. |
| 7,842,975 B2 | 11/2010 | Becker et al. |
| 7,873,929 B2 * | 1/2011 | Kahng et al. .................. 716/118 |
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,932,544 B2 | 4/2011 | Becker et al. |
| 7,932,545 B2 | 4/2011 | Becker et al. |
| 7,934,184 B2 | 4/2011 | Zhang |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 * | 3/2012 | Tanaka .................. 365/72 |
| 8,134,183 B2 | 3/2012 | Becker et al. |

(56) References Cited

U.S. PATENT DOCUMENTS

| | | |
|---|---|---|
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 * | 5/2012 | Toubou ................. 257/207 |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 * | 7/2012 | Quandt et al. ............ 716/100 |
| 8,217,428 B2 | 7/2012 | Becker et al. |
| 8,225,239 B2 * | 7/2012 | Reed et al. ............... 716/53 |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,283,701 B2 | 10/2012 | Becker et al. |
| 8,316,327 B2 | 11/2012 | Herold |
| 8,356,268 B2 | 1/2013 | Becker et al. |
| 8,378,407 B2 | 2/2013 | Audzeyeu et al. |
| 8,402,397 B2 | 3/2013 | Robles et al. |
| 8,422,274 B2 | 4/2013 | Tomita et al. |
| 8,436,400 B2 | 5/2013 | Becker et al. |
| 8,453,094 B2 | 5/2013 | Kornachuk et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0229868 A1 | 12/2003 | White et al. |
| 2003/0229875 A1 | 12/2003 | Smith et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chan et al. |
| 2005/0264324 A1 | 12/2005 | Nakazato |
| 2005/0266621 A1 | 12/2005 | Kim |
| 2005/0268256 A1 | 12/2005 | Tsai et al. |
| 2005/0280031 A1 | 12/2005 | Yano |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 * | 6/2006 | Ichiryu et al. ................. 716/1 |
| 2006/0146638 A1 | 7/2006 | Chang et al. |
| 2006/0151810 A1 | 7/2006 | Ohshige |
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2007/0001304 A1 | 1/2007 | Liaw |
| 2007/0002617 A1 | 1/2007 | Houston |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0256039 A1 | 11/2007 | White |
| 2007/0257277 A1 | 11/2007 | Takeda et al. |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0005712 A1 | 1/2008 | Charlebois et al. |
| 2008/0046846 A1 | 2/2008 | Chew et al. |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0099795 A1 | 5/2008 | Bernstein et al. |
| 2008/0127000 A1 | 5/2008 | Majumder et al. |

(56) References Cited

U.S. PATENT DOCUMENTS

| | | |
|---|---|---|
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 * | 11/2008 | Torok et al. ............ 365/158 |
| 2008/0308848 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1 | 3/2009 | Ban et al. |
| 2009/0077524 A1 | 3/2009 | Nagamura et al. |
| 2009/0085067 A1 | 4/2009 | Hayashi et al. |
| 2009/0087991 A1 | 4/2009 | Yatsuda et al. |
| 2009/0101940 A1 | 4/2009 | Barrows et al. |
| 2009/0106714 A1 | 4/2009 | Culp et al. |
| 2009/0155990 A1 | 6/2009 | Yanagidaira et al. |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0273100 A1 * | 11/2009 | Aton et al. ............... 257/786 |
| 2009/0280582 A1 | 11/2009 | Thijs et al. |
| 2009/0302372 A1 | 12/2009 | Chang et al. |
| 2009/0319977 A1 | 12/2009 | Saxena et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0203689 A1 | 8/2010 | Bernstein et al. |
| 2010/0224943 A1 | 9/2010 | Kawasaki |
| 2010/0229140 A1 | 9/2010 | Strolenberg et al. |
| 2010/0232212 A1 | 9/2010 | Anderson et al. |
| 2010/0264468 A1 | 10/2010 | Xu |
| 2010/0270681 A1 | 10/2010 | Bird et al. |
| 2010/0287518 A1 | 11/2010 | Becker |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2012/0012932 A1 | 1/2012 | Perng et al. |
| 2012/0273841 A1 * | 11/2012 | Quandt et al. ............ 257/208 |
| 2013/0097574 A1 | 4/2013 | Balabanov et al. |
| 2013/0200465 A1 | 8/2013 | Becker et al. |
| 2013/0200469 A1 | 8/2013 | Becker et al. |
| 2013/0207198 A1 | 8/2013 | Becker et al. |
| 2013/0207199 A1 | 8/2013 | Becker et al. |
| 2013/0254732 A1 | 9/2013 | Kornachuk et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 61-182244 | 8/1986 |
| JP | S63-310136 A | 12/1988 |
| JP | H07-153927 A | 6/1995 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2003-264231 | 9/2003 |
| JP | 2004-013920 | 1/2004 |
| JP | 2004-200300 | 7/2004 |
| JP | 2004-241529 | 8/2004 |
| JP | 2004-342757 A | 12/2004 |
| JP | 2005-020008 | 1/2005 |

(56) References Cited

FOREIGN PATENT DOCUMENTS

| | | |
|---|---|---|
| JP | 2003-359375 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-114752 | 10/2006 |
| JP | 2006-303022 A | 11/2006 |
| KR | 10-0417093 | 6/1997 |
| KR | 10-1998-087485 | 12/1998 |
| KR | 1998-0084215 A | 12/1998 |
| KR | 10-1999-0057943 A | 7/1999 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 10-2005-0030347 A | 3/2005 |
| KR | 2005-0037965 A | 4/2005 |
| KR | 2006-0108233 A | 10/2006 |
| TW | 386288 | 4/2000 |
| WO | WO 2005/104356 | 11/2005 |
| WO | WO 2006/014849 | 2/2006 |
| WO | WO 2006/052738 | 5/2006 |
| WO | WO 2007/014053 | 2/2007 |
| WO | WO 2007/103587 | 9/2007 |

OTHER PUBLICATIONS

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-Al and Insulator and its Application to Quarter Micron Gate Array LSIs", 1995, IEEE, Japan, pp. 473-476.

Axelrad et al. "Efficient Full-Chip Yield Analysis Methodology for OPC-Corrected VLSI Design", 2000, International Symposium on Quality Electronic Design (ISQED).

Balasinski et al. "Impact of Subwavelength CD Tolerance on Device Performance", 2002, SPIE.

Burkhardt, et al., "Dark Field Double Dipole Lithography (DDL) for Back-End-Of-Line Processes", 2007, SPIE Proceeding Series, vol. 6520; 65200K.

Capetti, et al., "Sub kl=0.25 Lithography with Double Patterning Technique for 45nm Technology Node Flash Memory Devices at λ=193nm", 2007, SPIE Proceeding Series, vol. 6520; 65202K.

Capodieci, L., et al., "Toward a Methodology for Manufacturability-Driven Design Rule Exploration," DAC 2004, Jun. 7-11, 2004, San Diego, CA.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Patterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

Clark et al. "Managing Standby and Active Mode Leakage Power in Deep Sub-Micron Design", Aug. 9-11, 2004, ACM.

Cobb et al. "Using OPC to Optimize for Image Slope and Improve Process Window", 2003, SPIE.

Devgan "Leakage Issues in IC Design: Part 3", 2003, CCAD.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceeding Series, vol. 6520; 65200G.

El-Gamal, "Fast, Cheap and Under Control: The Next Implementation Fabric", Jun. 2-6, 2003, ACM Press, pp. 354-355.

Firedberg, et al., "Modeling Within-Field Gate Length Spatial Variation for Process-Design Co-Optimization," 2005 Proc. of SPIE vol. 5756, pp. 178-188.

Frankel, "Quantum State Control Interference Lithography and Trim Double Patterning for 32-16nm Lithography", 2007, SPIE Proceeding Series, vol. 6520; 65202L.

Garg, et al. "Lithography Driven Layout Design", 2005, IEEE.

Grobman et al. "Reticle Enhancement Technology Trends: Resource and Manufacturability Implications for the Implementation of Physical Designs" Apr. 1-4, 2001, ACM.

Grobman et al. "Reticle Enhancement Technology: Implications and Challenges for Physical Design" Jun. 18-22, 2001, ACM.

Gupta et al. "Enhanced Resist and Etch CD Control by Design Perturbation", Oct. 4-7, 2006, Society of Photo-Optical Instrumentation Engineers.

Gupta et al. "A Practical Transistor-Level Dual Threshold Voltage Assignment Methodology", 2005, Sixth International Symposium on Quality Electronic Design (ISQED).

Gupta et al. "Detailed Placement for Improved Depth of Focus and CD Control", 2005, ACM.

Gupta et al. "Joining the Design and Mask Flows for Better and Cheaper Masks", Oct. 14-17, 2004, Society of Photo-Optical Instrumentation Engineers.

Gupta et al. "Manufacturing-Aware Physical Design", 2003, ACM.

Gupta et al. "Selective Gate-Length Biasing for Cost-Effective Runtime Leakage Control", Jun. 7-11, 2004, ACM.

Gupta et al. "Wafer Topography-Aware Optical Proximity Correction for Better DOF Margin and CD Control", Apr. 13-15, 2005, SPIE.

Gupta, Puneet, et al., "Manufacturing-aware Design Methodology for Assist Feature Correctness," 2005.

Ha et al., "Reduction in the Mask Error Factor by Optimizing the Diffraction Order of a Scattering Bar in Lithography," Journal of the Korean Physical Society, vol. 46, No. 5, May 2005, pp. 1213-1217.

Hakko, et al., "Extension of the 2D-TCC Technique to Optimize Mask Pattern Layouts," 2008 Proc. of SPIE vol. 7028, 11 pages.

Halpin et al., "Detailed Placement with Net Length Constraints," Publication Year 2003, Proceedings of the 3rd IEEE International Workshop on System-on-Chip for Real-Time Applications, pp. 22-27.

Hayashida, et al., "Manufacturable Local Interconnect technology Fully Compatible with Titanium Salicide Process", Jun. 11-12, 1991, VMIC Conference.

Heng, et al., "A VLSI Artwork Legalization Technique Base on a New Criterion of Minimum Layout Perturbation", 1997, ACM Press, pp. 116-121.

Heng, et al., "Toward Through-Process Layout Quality Metrics", Mar. 3-4, 2005, Society of Photo-Optical Instrumentation Engineers.

Hu, et al., "Synthesis and Placement Flow for Gain-Based Programmable Regular Fabrics", Apr. 6-9, 2003, ACM Press, pp. 197-203.

Hur et al., "Mongrel: Hybrid Techniques for Standard Cell Placement," Publication Year 2000, IEEE/ACM International Conference on Computer Aided Design, ICCAD-2000, pp. 165-170.

Hutton, et al., "A Methodology for FPGA to Structured-ASIC Synthesis and Verification", 2006, EDAA, pp. 64-69.

Intel Core Microarchitecture White Paper "Introducing the 45 nm Next-Generation Intel Core Microarchitecture," 2007, Intel Corporation.

Jayakumar, et al., "A Metal and VIA Maskset Programmable VLSI Design Methodology using PLAs", 2004, IEEE, pp. 590-594.

Jhaveri, T. et al., Maximization of Layout Printability/Manufacturability by Extreme Layout Regularity, Proc. of the SPIE, Apr. 2006.

Kang, S.M., Metal-Metal Matrix (M3) for High-Speed MOS VLSI Layout, IEEE Trans. on CAD, vol. CAD-6, No. 5, Sep. 1987.

Kawashima, et al., "Mask Optimization for Arbitrary Patterns with 2D-TCC Resolution Enhancement Technique," 2008 Proc. of SPIE vol. 6924, 12 pages.

Kheterpal, et al., "Design Methodology for IC Manufacturability Based on Regular Logic-Bricks", DAC, Jun. 13-17, 2005, IEEE/AMC, vol. 6520.

Kheterpal, et al., "Routing Architecture Exploration for Regular Fabrics", DAC, Jun. 7-11, 2004, ACM Press, pp. 204-207.

Kim, et al., "Double Exposure Using 193nm Negative Tone Photoresist", 2007, SPIE Proceeding Series, vol. 6520; 65202M.

(56) References Cited

OTHER PUBLICATIONS

Kim, et al., "Issues and Challenges of Double Patterning Lithography in DRAM", 2007, SPIE Proceeding Series, vol. 6520; 65200H.
Koorapaty, et al., "Exploring Logic Block Granularity for Regular Fabrics", 2004, IEEE, pp. 1-6.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.
Kuh et al., "Recent Advances in VLSI Layout," Publication Year 1990, Proceedings of the IEEE, vol. 78, Iss. 2, pp. 237-263.
Lavin et al. "Backend DAC Flows for "Restrictive Design Rules"", 2004, IEEE.
Li, et al., "A Linear-Centric Modeling Approach to Harmonic Balance Analysis", 2002, IEEE, pp. 1-6.
Li, et al., "Nonlinear Distortion Analysis Via Linear-Centric Models", 2003, IEEE, pp. 897-903.
Liebmann et al., "Optimizing Style Options for Sub-Resolution Assist Features," Proc. of SPIE vol. 4346, 2001, pp. 141-152.
Liebmann, et al., "High-Performance Circuit Design for the RET-Enabled 65nm Technology Node", Feb. 26-27, 2004, SPIE Proceeding Series, vol. 5379 pp. 20-29.
Liebmann, L. W., Layout Impact of Resolution Enhancement Techniques: Impediment or Opportunity?, International Symposium on Physical Design, 2003.
Mansfield et al., "Lithographic Comparison of Assist Feature Design Strategies," Proc. of SPIE vol. 4000, 2000, pp. 63-76.
Miller, "Manufacturing-Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, 2011.
Mo, et al., "Checkerboard: A Regular Structure and its Synthesis, International Workshop on Logic and Synthesis", 2003, Department of Electrical Engineering and Computer Sciences, UC Berkeley, California, pp. 1-7.
Mo, et al., "PLA-Based Regular Structures and Their Synthesis", 2003, Department of Electrical Engineering and Computer Sciences, IEEE, pp. 723-729.
Mo, et al., "Regular Fabrics in Deep Sub-Micron Integrated-Circuit Design", 2004, Kluwer Academic Publishers, Entire Book.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE.
Op de Beek, et al., "Manufacturability issues with Double Patterning for 50nm half pitch damascene applications, using RELACS® shrink and corresponding OPC", 2007, SPIE Proceeding Series, vol. 6520; 65200I.
Or-Bach, "Programmable Circuit Fabrics", Sep. 18, 2001, e-ASIC, pp. 1-36.
Otten, et al., "Planning for Performance", DAC 1998, ACM Inc., pp. 122-127.
Pack et al. "Physical & Timing Verification of Subwavelength-Scale Designs-Part I: Lithography Impact on MOSFETs", 2003, SPIE.
Pandini, et al., "Congestion-Aware Logic Synthesis", 2002, IEEE, pp. 1-8.
Pandini, et al., "Understanding and Addressing the Impact of Wiring Congestion During Technology Mapping", ISPD Apr. 7-10, 2002, ACM Press, pp. 131-136.
Patel, et al., "An Architectural Exploration of Via Patterned Gate Arrays, ISPD 2003", Apr. 6, 2003, pp. 184-189.

Pham, D., et al., "FINFET Device Junction Formation Challenges," 2006 International Workshop on Junction Technology, pp. 73-77, Aug. 2006.
Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.
Poonawala, et al., "ILT for Double Exposure Lithography with Conventional and Novel Materials", 2007, SPIE Proceeding Series, vol. 6520; 65202Q.
Qian et al. "Advanced Physical Models for Mask Data Verification and Impacts on Physical Layout Synthesis" 2003. IEEE.
Ran, et al., "An Integrated Design Flow for a Via-Configurable Gate Array", 2004, IEEE, pp. 582-589.
Ran, et al., "Designing a Via-Configurable Regular Fabric", Custom Integrated Circuits Conference (CICC). Proceedings of the IEEE, Oct. 2004, Oct. 1, 2004, pp. 423-426.
Ran, et al., "On Designing Via-Configurable Cell Blocks for Regular Fabrics" Proceedings of the Design Automation Conference (DAC) 2004, Jun. 2004, ACM Press, s 198-203.
Ran, et al., "The Magic of a Via-Configurable Regular Fabric", Proceedings of the IEEE International Conference on Computer Design (ICCD) Oct. 2004.
Ran, et al., "Via-Configurable Routing Architectures and Fast Design Mappability Estimation for Regular Fabrics", 2005, IEEE, pp. 25-32.
Reis, et al., "Physical Design Methodologies for Performance Predictability and Manufacturability", Apr. 14-16, 2004, ACM Press, pp. 390-397.
Robertson, et al., "The Modeling of Double Patterning Lithographic Processes", 2007, SPIE Proceeding Series, vol. 6520; 65200J.
Rosenbluth, et al., "Optimum Mask and Source Patterns to Print a Given Shape," 2001 Proc. of SPIE vol. 4346, pp. 486-502.
Rovner, "Design for Manufacturability in Via Programmable Gate Arrays", May 2003, Graduate School of Carnegie Mellon University.
Sengupta, "An Integrated CAD Framework Linking VLSI Layout Editors and Process Simulators", 1998, Thesis for Rice University, pp. 1-101.
Sengupta, et al., "An Integrated CAD Framework Linking VLSI Layout Editors and Process Simulators", 1996, SPIE Proceeding Series, vol. 2726; pp. 244-252.
Sherlekar, "Design Considerations for Regular Fabrics", Apr. 18-21, 2004, ACM Press, pp. 97-102.
Shi et al., "Understanding the Forbidden Pitch and Assist Feature Placement," Proc. of SPIE, vol. 4562, 2002, pp. 968-979.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Socha, et al., "Simultaneous Source Mask Optimization (SMO)," 2005 Proc. of SPIE vol. 5853, pp. 180-193.
Sreedhar et al. "Statistical Yield Modeling for Sub-Wavelength Lithography", 2008, IEEE.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7-11, 2004, ACM Press, pp. 874-877.
Tian et al. "Model-Based Dummy Feature Placement for Oxide Chemical_Mechanical Polishing Manufacturability" 2000, ACM.
Tong, et al., "Regular Logic Fabrics for a Via Patterned Gate Array (VPGA), Custom Integrated Circuits Conference", Sep. 2003, Proceedings of the IEEE, pp. 53-56.
Vanleenhove, et al., "A Litho-Only Approach to Double Patterning", 2007, SPIE Proceeding Series, vol. 6520; 65202F.
Wang, et al., "Performance Optimization for Gridded-Layout Standard Cells", 2004, vol. 5567 SPIE.
Wang, J. et al., Standard Cell Layout with Regular Contact Placement, IEEE Trans. on Semicon. Mfg., vol. 17, No. 3, Aug. 2004.
Webb, Clair, "45nm Design for Manufacturing," Intel Technology Journal, vol. 12, Issue 02, Jun. 17, 2008, ISSN 1535-864X, pp. 121-130.
Webb, Clair, "Layout Rule Trends and Affect upon CPU Design", 2006, vol. 6156 SPIE.

(56) References Cited

OTHER PUBLICATIONS

Wenren, et al., "The Improvement of Photolithographic Fidelity of Two-dimensional Structures Though Double Exposure Method", 2007, SPIE Proceeding Series, vol. 6520; 652021.
Wilcox, et al., "Design for Manufacturability: A Key to Semiconductor Manufacturing Excellence", 1998, IEEE, pp. 308-313.
Wong, et al., "Resolution Enhancement Techniques and Design for Manufacturability: Containing and Accounting for Variabilities in Integrated Circuit Creation," J. Micro/Nanolith. MEMS MOEMS, Jul.-Sep. 2007, vol. 6(3), 2 pages.
Wu, et al., "A Study of Process Window Capabilities for Two-dimensional Structures under Double Exposure Condition", 2007, SPIE Proceeding Series, vol. 6520; 65202O.
Xiong, et al., "The Constrained Via Minimization Problem for PCB and VLSI Design", 1988, ACM PRESS/IEEE, pp. 573-578.
Yamamaoto, et al., "New Double Exposure Technique without Alternating Phase Shift Mask", 2007, SPIE Proceeding Series, vol. 6520; 652052P.
Yamazoe, et al., "Resolution Enhancement by Aerial Image Approximation with 2D-TCC," 2007 Proc. of SPIE vol. 6730, 12 pages.
Yang, et al., "Interconnection Driven VLSI Module Placement Based on Quadratic Programming and Considering Congestion Using LFF Principles", 2004, IEEE, pp. 1243-1247.
Yao, et al., "Multilevel Routing With Redundant Via Insertion", Oct. 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Jul.-Sep. 2007, vol. 6(3), 16 pages.
Zheng, et al."Modeling and Analysis of Regular Symmetrically Structured Power/Ground Distribution Networks", DAC, Jun. 10-14, 2002, ACM Press, pp. 395-398.
Zhu, et al., "A Stochastic Integral Equation Method for Modeling the Rough Surface Effect on Interconnect Capacitance", 2004, IEEE.
Zhu, et al., "A Study of Double Exposure Process Design with Balanced Performance Parameters for Line/Space Applications", 2007, SPIE Proceeding Series, vol. 6520; 65202H.
Zuchowski, et al., "A Hybrid ASIC and FPGA Architecture", 2003, IEEE, pp. 187-194.
Alam, Syed M. et al., "A Comprehensive Layout Methodology and Layout-Specific Circuit Analyses for Three-Dimensional Integrated Circuits," Mar. 21, 2002.
Alam, Syed M. et al., "Layout-Specific Circuit Evaluation in 3-D Integrated Circuits," May 2003.
Aubusson, Russel, "Wafer-Scale Integration of Semiconductor Memory," Apr. 1979.
Bachtold, "Logic Circuits with Carbon," Nov. 9, 2001.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1997.
Cao, Ke, "Design for Manufacturing (DFM) in Submicron VLSI Design," Aug. 2007.
Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.
Chang, Leland et al., "Stable SRAM Cell Design for the 32 nm Node and Beyond," Jun. 16, 2005.
Cheung, Peter, "Layout Design," Apr. 4, 2004.
Chinnery, David, "Closing the Gap Between ASIC & Custom: Tools and Techniques for High-Performance ASIC Design," Jun. 30, 2002.
Chou, Dyiann et al., "Line End Optimization through Optical Proximity Correction (OPC): A Case Study," Feb. 19, 2006.
Clein, Dan, "CMOS IC Layout: Concepts, Methodologies, and Tools," Dec. 22, 1999.
Cowell, "Exploiting Non-Uniform Access Time," Jul. 2003.
Das, Shamik, "Design Automation and Analysis of Three-Dimensional Integrated Circuits," May 1, 2004.

Dehaene, W. et al., "Technology-Aware Design of SRAM Memory Circuits," Mar. 2007.
Deng, Liang et al., "Coupling-aware Dummy Metal Insertion for Lithography," p. 1, col. 2, 2007.
Devoivre et al., "Validated 90nm CMOS Technology Platfoun with Low-k Copper Interconnects for Advanced System-on-Chip (SoC)," 2002.
Enbody, R. J., "Near-Optimal n-Layer Channel Routing," 1986.
Ferretti, Marcos et al., "High Performance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.
Greenway, Robert et al., "32nm 1-D Regular Pitch SRAM Bitcell Design for Interference-Assisted Lithography," 2008.
Gupta et al., "Modeling Edge Placement Error Distribution in Standard Cell Library," Feb. 23-24, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurata et al., "A Genuine Design Manufacturability Check for Designers," 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," 1998.
Jakusovszky, "Linear IC Parasitic Element Simulation Methodology," Oct. 1, 1993.
Jangkrajarng, Nuttom et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills, Proc. of ISQED," pp. 586-591, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, 2003.
Liebmann, Lars et al., "TCAD development for lithography resolution enhancement," Sep. 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, 2006.
MOSIS, "Design Rules MOSIS Scalable CMOS (SCMOS) (Revision 8.00)," Oct. 4, 2004.
Muta et al., "Manufacturability-Aware Design of Standard Cells," pp. 2686-2690, Figs. 3, 12, Dec. 2007.
Na, Kee-Yeol et al., "A Novel Single Polysilicon EEPROM Cell With a Polyfinger Capacitor," Nov. 30, 2007.
Pan et al., "Redundant Via Enahnced Maze Routing for Yield Improvement," 2005.

(56) References Cited

OTHER PUBLICATIONS

Park, Tae Hong, "Characterization and Modeling of Pattern Dependencies in Copper Interconnects for Integrated Circuits," Ph.D. Thesis, MIT, 2002.
Patel, Chetan, "An Architectural Exploration of Via Patterned Gate Arrays (CMU Master's Project)," May 2003.
Pease, R. Fabian et al., "Lithography and Other Patterning Techniques for Future Electronics," 2008.
Serrano, Diego Emilio, Pontificia Universidad Javeriana Facultad De Ingenieria, Departamento De Electronica, "Diseño De Multiplicador 4 X 8 en VLSI, Introduccion al VLSI," 2006.
Pramanik, "Impact of layout on variability of devices for sub 90nm technologies," 2004.
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements for 90 and 65 Nm Nodes Via Simultaneous Optimization of Numerical Aperture, Illumination and Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Uniformity in a Shallow Trench Isolation Process," IEEE Trans. on Computer-Aided Design of Integrated Circuits and Systems, vol. 21, No. 1, pp. 63-71, Jan. 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, 2001.
Torres, J. A. et al., "RET Compliant Cell Generation for sub-130nm Processes," 2002.
Uyemura, John P., "Introduction to VLSI Circuits and Systems," Chapters 2, 3, 5, and Part 3, 2002.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," 2006.
Wang, Dunwei et al., "Complementary Symmetry Silicon Nanowire Logic: Power-Efficient Inverters with Gain," 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions, and Their Impact on Design," 2003.
Xu, Gang, "Redundant-Via Enhanced Maze Routing for Yield Improvement," 2005.
Yang, Jie, "Manufacturability Aware Design," pp. 93, 102, Fig. 5.2, 2007.
Yongshun, Wang et al., "Static Induction Devices with Planar Type Buried Gate," 2004.
Zobrist, George (editor), "Progress in Computer Aided VLSI Design: Implementations (Ch. 5)," 1990.
Liebmann et al., "Integrating DfM Components into a Cohesive Design-to-Silicon Solution," Proc. SPIE 5756, Design and Process Integration for Microelectronic Manufacturing III, 1 (May 13, 2005).
Liu et al., "Double Patterning with Multilayer Hard Mask Shrinkage for Sub 0.25 k1 Lithography," Proc. SPIE 6520, Optical Microlithography XX, 65202J (Mar. 27, 2007).
Mosis, "MOSIS Scalable CMOS (SCMOS) Design Rules (Revision 7.2)," 1995.

\* cited by examiner

— 103

| Row | | | | | |
|---|---|---|---|---|---|
| Row 10 | A | G | R | C | S |
| Row 9 | B | O | L | I | U |
| Row 8 | X | D | W | | P |
| Row 7 | F | A | Y | J | N |
| Row 6 | T | | H | M | |
| Row 5 | Q | V | Z | E | K |
| Row 4 | B | O | L | I | U |
| Row 3 | F | A | G | J | N |
| Row 2 | X | D | W | | P |
| Row 1 | A | G | R | G | A |

Fig. 1B

METHODS FOR CELL BOUNDARY ENCROACHMENT AND LAYOUTS IMPLEMENTING THE SAME

CLAIM OF PRIORITY

This application claims priority under 35 U.S.C. 119(e) to U.S. Provisional Patent Application No. 61/251,279, filed Oct. 13, 2009, entitled "Methods for Cell Boundary Encroachment and Layouts Implementing the Same," the disclosure of which is incorporated herein by reference in its entirety.

BACKGROUND

In modern semiconductor chip ("chip") design, standard cells are placed on the chip to define a particular logic function. To ensure that each standard cell will be manufacturable when arbitrarily placed on the chip, each standard cell is defined to have an edge exclusion zone sized equal to one-half of a design rule spacing requirement between adjacent conductive features. In this manner, when any two standard cells are placed next to each other, their combined exclusion zone sizes at their interfacing boundaries will equal at least the design rule spacing requirement between adjacent conductive features. Thus, the exclusion zone enables features to be placed arbitrarily within a standard cell without concern for cell-to-cell interface problems. However, when many standard cells are placed together on the chip, the edge exclusion zones associated with the standard cells can combine to occupy an expensive amount of chip area.

In view of the foregoing, it is of interest to optimize cell layout and placement such that chip area and routing resources can be most efficiently utilized, particularly when cells are defined according to a constrained layout architecture.

SUMMARY

In one embodiment, a semiconductor device is disclosed to include a plurality of cells. Each of the plurality of cells has a respective outer cell boundary defined to circumscribe the cell in an orthogonal manner. Also, each of the plurality of cells includes circuitry for performing one or more logic functions. This circuitry includes a plurality of conductive features defined in one or more levels of the cell. Within the semiconductor device, one or more of the conductive features in at least one level of a given cell is an encroaching feature positioned to encroach by an encroachment distance into an exclusion zone. The exclusion zone occupies an area within the cell defined by an exclusion distance extending perpendicularly inward into the given cell from a first segment of the outer cell boundary. The exclusion distance is based on a design rule distance. The design rule distance is a minimum separation distance required between conductive features in adjacently placed cells on the semiconductor device.

In one embodiment, a semiconductor device is disclosed to include a plurality of cells. Each of the plurality of cells has a respective outer cell boundary defined to circumscribe the cell in an orthogonal manner. Also, each of the plurality of cells includes circuitry for performing one or more logic functions. This circuitry includes a plurality of conductive features defined in one or more levels of the cell. At least one instance of a given cell is defined on the semiconductor device in accordance with any one of multiple versions of the given cell or combination thereof. The multiple versions of the given cell include a first version of the given cell having an encroachment region defined within a particular cell level adjacent to a first segment of the outer cell boundary. The first version of the given cell also includes a spacing allowance region defined within the particular cell level adjacent to a second segment of the outer cell boundary located opposite the given cell from the first segment. The multiple versions of the given cell also include a second version of the given cell having the encroachment region defined within the particular cell level adjacent to both the first and second segments of the outer cell boundary. The multiple versions of the given cell also include a third version of the given cell having the spacing allowance region defined within the particular cell level adjacent to both the first and second segments of the outer cell boundary. The encroachment region is defined as a peripheral region of the particular cell level of the given cell within which at least one encroaching feature is positioned to encroach by an encroachment distance into an exclusion zone. The exclusion zone occupies an area within the given cell defined by an exclusion distance extending perpendicularly inward into the given cell from the outer cell boundary adjacent to the encroachment region. The exclusion distance is based on a design rule distance. The spacing allowance region is defined to extend perpendicularly inward into the given cell from the outer cell boundary by a spacing allowance distance equal to at least the encroachment distance plus the exclusion distance. The spacing allowance region within the particular cell level does not include any conductive features.

In one embodiment, a cell library stored in a digital format on a computer readable storage medium is disclosed to include one or more layouts of a cell. The cell has an outer cell boundary defined to circumscribe the cell in an orthogonal manner. The cell is defined to include circuitry for performing one or more logic functions. Each of the layouts for the cell include layout shapes for conductive features in one or more levels of the cell. The layouts of the cell include a first layout of the cell having an encroachment region defined within a given level of the cell adjacent to a first segment of the outer cell boundary. The encroachment region includes at least one encroaching layout shape positioned to encroach by an encroachment distance into an exclusion zone. The exclusion zone occupies an area within the given cell defined by an exclusion distance extending perpendicularly inward into the cell from the first segment of the outer cell boundary. The exclusion distance is based on a design rule distance. The first layout of the cell also includes a spacing allowance region defined within the given level of the cell adjacent to a second segment of the outer cell boundary, located opposite the cell from the first segment of the outer cell boundary. The spacing allowance region extends perpendicularly inward into the cell from the second segment of the outer cell boundary by a spacing allowance distance equal to at least the encroachment distance of the encroachment region plus the exclusion distance. The spacing allowance region in the cell level does not include any layout shapes.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 1B shows placement of a number of cells A-Z of various logic function in rows within the logic block, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Cell Description

Figure 1A:
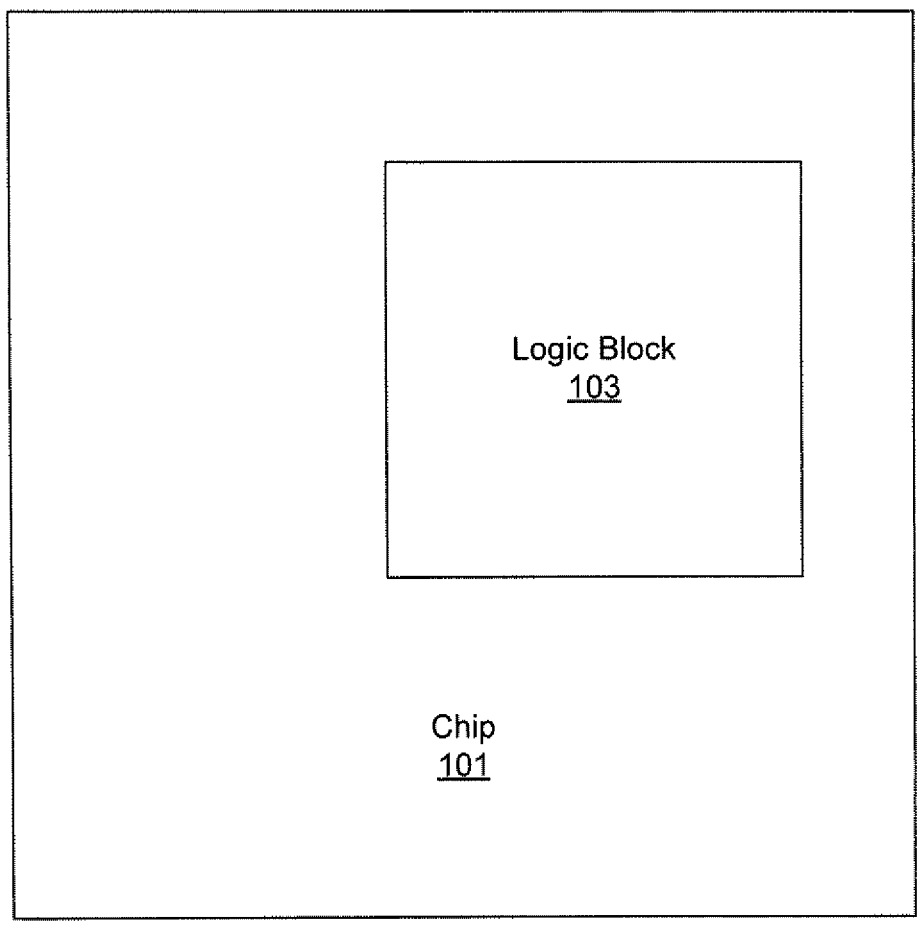
FIG. 1A is an illustration showing a semiconductor chip defined to include a logic block, in accordance with one embodiment of the present invention.

FIG. 1A is an illustration showing a semiconductor chip ("chip") 101 defined to include a logic block 103, in accordance with one embodiment of the present invention. The logic block 103 includes integrated circuit devices in the form of multi-level structures defined on a silicon substrate of the chip 101. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials. The structural features used to define the diffusion regions, transistor devices, metallization lines, interconnects, etc. within each level of the chip 101 are defined according to a specified layout. Additionally, the global layout for a given level of the chip 101 may be segmented into many small layout areas, where each layout area is associated with a given logic construct. Moreover, layout areas within multiple levels of the chip 101 within a given vertical column of the chip 101 can be integrated together to form a logic unit referred to as a cell.

A cell, as referenced herein, represents an abstraction of a logic function, and encapsulates lower-level integrated circuit layouts for implementing the logic function. It should be understood that a given logic function can be represented by multiple cell variations, wherein the cell variations may be differentiated by feature size, performance, and process compensation technique (PCT) processing. For example, multiple cell variations for a given logic function may be differentiated by power consumption, signal timing, current leakage, chip area, OPC (optical proximity correction), RET (reticle enhancement technology), etc. It should also be understood that each cell description includes the layouts for the cell in each level of a chip within the associated vertical column of the chip, as required to implement the logic function of the cell. More specifically, a cell description may include layouts for the cell in each level of the chip extending from the substrate level up through a particular interconnect level.

FIG. 1B shows placement of a number of cells A-Z of various logic function in rows within the logic block 103, in accordance with one embodiment of the present invention. In this example embodiment, consider that the plurality of cells A-Z are available for use within the logic block 103, where each of cells A-Z is defined to perform a different logic function. In this example embodiment, the logic block 103 may be defined by placement of cells A-Z within rows 1-10 of the logic block 103, as shown in FIG. 1B. In this exemplary embodiment, the width of the cells as measured from left-to-right across a given row can vary from cell-to-cell. However, the height of the cells as measured vertically within a given row is essentially the same from cell-to-cell, thereby allowing the logic block 103 to be populated by adjacently defined rows of cells of consistent height. Also, in some embodiments, the height of cells may vary from row-to-row and/or within a row.

Dynamic Array Architecture

Generally speaking, a dynamic array architecture is provided to address semiconductor manufacturing process variability associated with a continually increasing lithographic gap. In the area of semiconductor manufacturing, lithographic gap is defined as the difference between the minimum size of a feature to be defined and the wavelength of light used to render the feature in the lithographic process, wherein the feature size is less than the wavelength of the light. Current lithographic processes utilize a light wavelength of 193 nm. However, current feature sizes are as small as 45 nm and are expected to get even smaller. With a size of 45 nm, the shapes are three times smaller than the wavelength of the light used to define the shapes. Also, considering that the interaction radius of light is about five light wavelengths, it should be appreciated that shapes exposed with a 193 nm light source will influence the exposure of shapes approximately 5*193 nm (965 nm) away.

In the dynamic array architecture, layout features in a given layer are shaped and spaced such that constructive and destructive interference of the light from neighboring features will be optimized to produce the best rendering of all features in the neighborhood. The feature-to-feature spacing in a given layer is proportional to the wavelength of the light used to expose the features. The light used to expose each feature within about a five light wavelength distance from a given feature will serve to enhance the exposure of the given feature to some extent. The exploitation of constructive interference of the standing light waves used to expose neighboring features enables the manufacturing equipment capability to be maximized and not be limited by concerns regarding light interactions during the lithography process.

In the dynamic array architecture, layout features are defined along a regular-spaced virtual grate (or regular-spaced virtual grid) in a number of levels of a cell, i.e., in a number of levels of a semiconductor chip, such as chip 101. The virtual grate is defined by a set of equally spaced, parallel virtual lines extending across a given level in a given chip area. The equal spacing, as measured perpendicularly between adjacent virtual lines of the virtual grate, is defined as the virtual grate pitch. In one embodiment, the layout features are sized substantially smaller than the wavelength of the light used in the lithographic process to form the physical shapes corresponding to the layout features.

In one embodiment, the virtual grate of a given level is oriented to be substantially perpendicular to the virtual grate of an adjacent level. For example, in this embodiment, a virtual grate for the first interconnect level (M1 level) (not shown) extends in a direction perpendicular to both the gate level and M2 level virtual grates. However, it should be appreciated, that in some embodiments, the virtual grate of a given level may be oriented either perpendicular or parallel to the virtual grate of an adjacent level.

Figure 2:
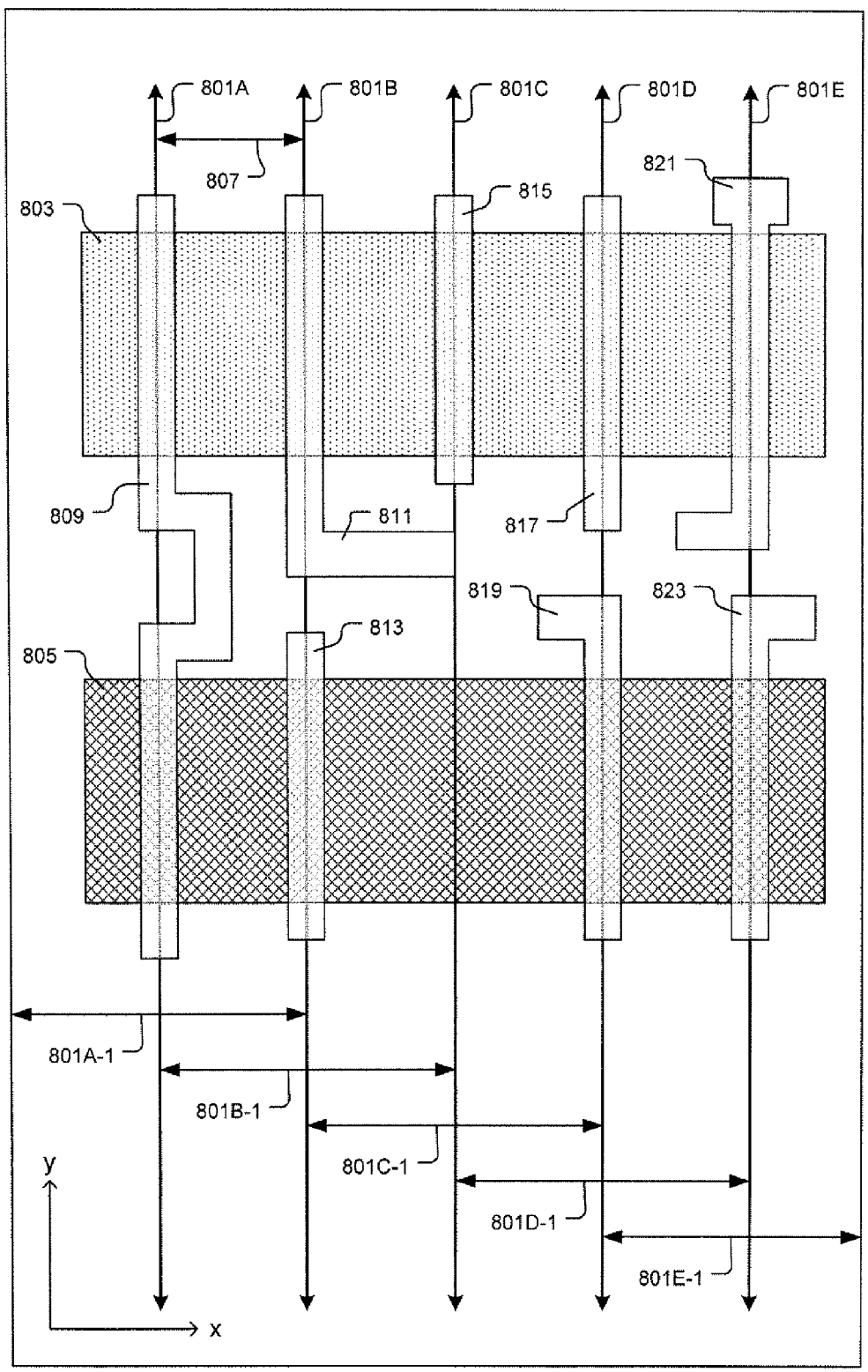
FIG. 2 shows an example of virtual lines defined within the dynamic array architecture, in accordance with one embodiment of the present invention.

FIG. 2 shows an example of virtual lines 801A-801E defined within the dynamic array architecture, in accordance with one embodiment of the present invention. Virtual lines 801A-801E extend across the layout in a parallel manner, with a perpendicular spacing therebetween equal to a specified pitch 807. For illustrative purposes, complementary diffusion regions 803 and 805 are shown in FIG. 2. It should be understood that the diffusion regions 803 and 805 are defined in a diffusion level below a gate level. Also, it should be understood that the diffusion regions 803 and 805 are provided by way of example and in no way represent any limitation on diffusion region size, shape, and/or placement within the diffusion level relative to the dynamic array architecture.

Within the dynamic array architecture, a feature layout channel is defined about a given virtual line so as to extend between virtual lines adjacent to the given virtual line. For example, feature layout channels 801A-1 through 801E-1 are defined about virtual lines 801A through 801E, respectively. It should be understood that each virtual line has a corresponding feature layout channel. Also, for virtual lines positioned adjacent to an edge of a prescribed layout space, e.g., adjacent to a cell boundary, the corresponding feature layout channel extends as if there were a virtual line outside the prescribed layout space, as illustrated by feature layout channels 801A-1 and 801E-1. It should be further understood that each feature layout channel is defined to extend along an entire length of its corresponding virtual line.

FIG. 2 further shows a number of exemplary layout features 809-823 defined in accordance with the feature layout channels 801A-1 through 801E-1 corresponding to virtual lines 801A through 801E, respectively. Within the dynamic array architecture, layout features associated with a given virtual line are defined within the feature layout channel associated with the virtual line. Also, physical contact is prohibited between layout features defined in feature layout channels that are associated with adjacent virtual lines.

A contiguous layout feature can include both a portion which defines an active part of a circuit, and a portion that does not define a part of the circuit. For example, in the gate level, a contiguous layout feature can extend over both a diffusion region and a dielectric region of an underlying chip level. In one embodiment, each portion of a gate level layout feature that forms a gate electrode of a transistor is positioned to be substantially centered upon a given virtual line. Furthermore, in this embodiment, portions of the gate level layout feature that do not form a gate electrode of a transistor can be positioned within the feature layout channel associated with the given virtual line. Therefore, a given gate level layout feature can be defined essentially anywhere within a feature layout channel, so long as gate electrode portions of the given gate level layout feature are centered upon the virtual line corresponding to the given feature layout channel, and so long as the given gate level layout feature complies with design rule spacing requirements relative to other gate level layout features in adjacent feature layout channels.

As shown in FIG. 2, the layout feature 809 is defined within the feature layout channel 801A-1 associated with virtual line 801A. Some portions of layout feature 809 are substantially centered upon the virtual line 801A. Also, other portions of layout feature 809 maintain design rule spacing requirements with layout features 811 and 813 defined within adjacent feature layout channel 801B-1. Similarly, layout features 811-823 are defined within their respective feature layout channel, and include portions substantially centered upon the virtual line corresponding to their respective feature layout channel. Also, it should be appreciated that each of layout features 811-823 maintains design rule spacing requirements with layout features defined within adjacent feature layout channels, and avoids physical contact with any other layout feature defined within adjacent feature layout channels.

As illustrated by the example feature layout channels 801A-1 through 801E-1 of FIG. 2, each feature layout channel is associated with a given virtual line and corresponds to a layout region that extends along the given virtual line and perpendicularly outward in each opposing direction from the given virtual line to a closest of either an adjacent virtual line or a virtual line outside a layout boundary. Also, it should be understood that each layout feature is defined within its feature layout channel without physically contacting another layout feature defined within an adjoining feature layout channel.

Some layout features may have one or more contact head portions defined at any number of locations along their length. A contact head portion of a given layout feature is defined as a segment of the layout feature having a height and a width of sufficient size to receive a contact structure, wherein "width" is defined across the substrate in a direction perpendicular to the virtual line of the given layout feature, and wherein "height" is defined across the substrate in a direction parallel to the virtual line of the given layout feature. It should be appreciated that a contact head of a layout feature, when viewed from above, can be defined by essentially any layout shape, including a square or a rectangle. Also, depending on layout requirements and circuit design, a given contact head portion of a layout feature may or may not have a contact defined thereabove.

In one embodiment, the layout features are defined to provide a finite number of controlled layout shape-to-shape lithographic interactions which can be accurately predicted and optimized for in manufacturing and design processes. In this embodiment, the layout features are defined to avoid layout shape-to-shape spatial relationships which would introduce adverse lithographic interaction within the layout that cannot be accurately predicted and mitigated with high probability. However, it should be understood that changes in direction of layout features within their feature layout channels are acceptable when corresponding lithographic interactions are predictable and manageable.

In one embodiment, each layout feature of a given level is substantially centered upon one of the virtual lines of the virtual grate associated with the given level. A layout feature is considered to be substantially centered upon a particular line of a virtual grate when a deviation in alignment between the centerline of the layout feature and the particular line of the virtual grate is sufficiently small so as to not reduce a manufacturing process window from what would be achievable with a true alignment between of the centerline of the layout feature and the line of the virtual grate. Therefore, in this embodiment, if there are layout features placed in different chip levels according to virtual grates of rational spatial relationship, the layout features will be aligned at a spatial frequency defined by the rational spatial relationship. In one embodiment, the above-mentioned manufacturing process window is defined by a lithographic domain of focus and exposure that yields an acceptable fidelity of the layout feature. In one embodiment, the fidelity of a layout feature is defined by a characteristic dimension of the layout feature.

In the dynamic array architecture, variations in a vertical cross-section shape of an as-fabricated layout feature can be tolerated to an extent, so long as the variation in the vertical cross-section shape is predictable from a manufacturing perspective and does not adversely impact the manufacture of the given layout feature or its neighboring layout features. In this regard, the vertical cross-section shape corresponds to a cut of the as-fabricated layout feature in a plane perpendicular to both the centerline of the layout feature and the substrate of the chip. It should be appreciated that variation in the vertical cross-section of an as-fabricated layout feature along its length can correspond to a variation in width of the layout feature along its length. Therefore, the dynamic array architecture also accommodates variation in the width of an as-fabricated layout feature along its length, so long as the width variation is predictable from a manufacturing perspective and does not adversely impact the manufacture of the layout feature or its neighboring layout features. Additionally, different layout features within a given level can be designed to have the same width or different widths.

In one embodiment, within a given level defined according to the dynamic array architecture, proximate ends of adjacent, co-aligned linear-shaped layout features may be separated from each other by a substantially uniform gap. More specifically, in this embodiment, adjacent ends of linear-shaped layout features defined along a common line of a virtual grate are separated by an end gap, and such end gaps within the level associated with the virtual grate may be defined to span a substantially uniform distance. Additionally, in one embodiment, a size of the end gaps is minimized within a manufacturing process capability so as to optimize filling of a given level with linear-shaped layout features.

Also, in the dynamic array architecture, a level can be defined to have any number of virtual grate lines occupied by any number of layout features. In one example, a given level can be defined such that all lines of its virtual grate are occupied by at least one layout feature. In another example, a given level can be defined such that some lines of its virtual grate are occupied by at least one layout feature, and other lines of its virtual grate are vacant, i.e., not occupied by any layout features. Furthermore, in a given level, any number of successively adjacent virtual grate lines can be left vacant. Also, the occupancy versus vacancy of virtual grate lines by layout features in a given level may be defined according to a pattern or repeating pattern of layout features across the given level.

Additionally, within the dynamic array architecture, vias and contacts are defined to interconnect a number of the layout features in various levels so as to form a number of functional electronic devices, e.g., transistors, and electronic circuits. Layout features for the vias and contacts can be aligned to a virtual grid, wherein a specification of this virtual grid is a function of the specifications of the virtual grates associated with the various levels to which the vias and contacts will connect. Thus, a number of the layout features in various levels form functional components of an electronic circuit. Additionally, some of the layout features within various levels may be non-functional with respect to an electronic circuit, but are manufactured nonetheless so as to reinforce manufacturing of neighboring layout features.

It should be understood that the dynamic array architecture is defined to enable accurate prediction of semiconductor device manufacturability with a high probability, even when layout features of the semiconductor device are sized smaller than a wavelength of light used to render the layout features in a lithographic manufacturing process. Additionally, it should be understood that the dynamic array architecture is defined by placement of layout features on a regular-spaced grate (or regular-spaced grid) in at least one level of a cell, such that layout features in a given level of the cell are confined within their feature layout channel, and such that layout features in adjacent feature layout channels do not physically contact each other. Furthermore, it should be understood that the dynamic array architecture can be applied to one or more chip levels. For example, in one embodiment, only the gate level of the chip is defined according to the dynamic array architectures. In another embodiment, the gate level and one or more interconnect levels are defined according to the dynamic array architecture.

It should be understood that in some embodiments the dynamic array architecture may only be applied to a portion of one chip level, with overlying portions of other chip levels unconstrained with respect to dynamic array architecture restrictions. For example, in one embodiment, the gate electrode level is defined to comply with the dynamic array architecture, and the higher interconnect levels are defined in an unconstrained manner, i.e., in a non-dynamic array manner. In this embodiment, the gate electrode level is defined by a virtual grate and its corresponding feature layout channels within which gate electrode level conductive features are defined, as discussed above. Also, in this embodiment, the layout features of the non-dynamic array higher interconnect levels can be unconstrained with regard to a virtual grate and associated feature layout channels. For instance, in this particular embodiment, layout features in any interconnect level above the gate electrode level can include bends so as to form arbitrary two-dimensionally shaped layout features. As an alternative to the above-mentioned embodiment, other embodiments can exist in which multiple chip levels are defined according to the dynamic array architecture.

It should be understood that the cell boundary encroachment techniques disclosed herein are equally applicable to any embodiment that uses the dynamic array architecture, regardless of the number of chip levels that are defined according to the dynamic array architecture. Additionally, although the cell boundary encroachment techniques are described below within the exemplary context of the dynamic array architecture, it should be understood that the principles of the cell boundary encroachment techniques are equally applicable to essentially any cell layout, including non-dynamic array architecture layouts, in which it is beneficial to allow certain non-continuous layout shapes to encroach within a design rule spacing buffer at a cell boundary, while ensuring that neighboring layout shapes in an adjacently placed cell are spaced sufficiently far away to ensure compliance with global shape-to-shape design rule spacing requirements.

Cell Boundary Encroachment Technique

Figure 3A:
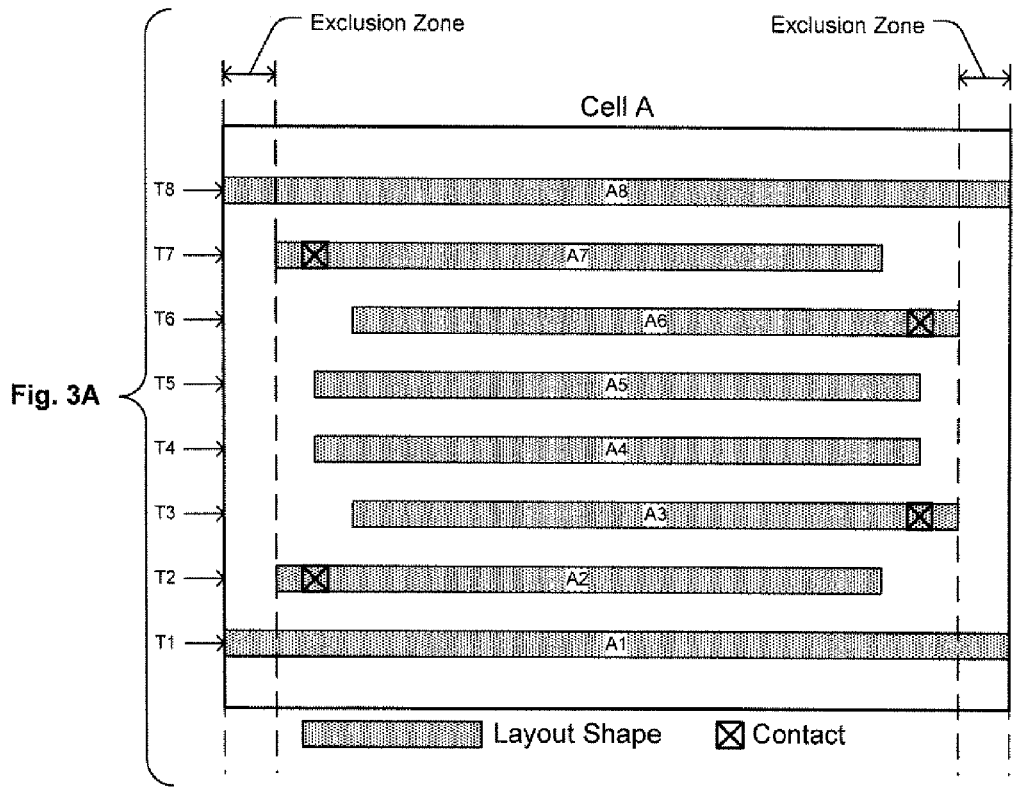
FIG. 3A shows a level of a cell (Cell A) in which layout shapes are defined to comply with a design rule distance buffer requirement at the left and right cell edge boundaries, in accordance with one embodiment of the present invention.

FIG. 3A shows a level of a cell (Cell A) in which layout shapes are defined to comply with a design rule distance buffer requirement at the left and right cell edge boundaries, in accordance with one embodiment of the present invention. A design rule distance, as used herein, is a minimum spacing distance required between conductive features in adjacently placed cells on the semiconductor chip to ensure proper fabrication of the conductive features. The design rule distance may be set by a fabrication facility based on the capabilities of their fabrication equipment and processes. Also, the design rule distance may vary between different cell levels. Moreover, the design rule distance can be defined as a function of various layout feature size parameters. Also, the design rule distance requirement can be defined by a combination of particular design rules. For example, in the gate electrode level, the design rule distance can be a combination of gate electrode width and spacing. For interconnect levels and contact or via interactions, the design rule distance can be a combination of interconnect feature overlap of contact/via, interconnect feature line-end-spacing, and in some cases, contact width, among others. Additionally, in one embodiment, the design rule distance, as used herein, can be a combination of established width and spacing design rules or a combination of established enclosure, width, and spacing design rules, or other appropriate combination of established design rules. For discussion purposes, the design rule distance referred to herein represents a distance value that is appropriate for a corresponding layout context in which it is applied.

In one embodiment, the design rule distance is within a range extending from about 30 nm (nanometers) to about 90 nm. In another embodiment, the design rule distance is less than 70 nm. The design rule distance buffer extends inside of the cell boundaries by a set fraction or multiple of one or more design rule values. In one embodiment, the design rule distance buffer is set at one-half of an established design rule spacing value. In another embodiment, the design rule distance buffer is set at one-third of the established design rule spacing value. It should be understood that in other embodiments, the design rule distance buffer can be set at other fractions or multiples of an established design rule value or combination of established design rule values.

In the example of FIG. 3A, layout shapes A1-A8 are placed along eight tracks T1-T8. In the dynamic array architecture, the tracks T1-T8 of FIG. 3A would correspond to virtual lines, and the layout shapes would be placed within feature layout channels respectively corresponding to those virtual lines. The layout shapes A1 and A8 on the bottom track T1 and top track T8, respectively, may define power/ground conductors and extend to the left and right cell boundaries so as to connect in a continuous manner with a corresponding layout shape in an adjacently placed cell. Layout shapes that extend completely to the cell boundary are referred to as "continuous shapes." The other layout shapes A2 through A7 are defined to ensure that they do not encroach within the design rule distance buffer at the left and right cell boundaries. Layout shapes that do not extend completely to the cell boundary are referred to as "non-continuous shapes." When cells are placed next to each other, layout shapes proximate to a given cell boundary interface along a given track will either extend continuously through the cell boundary interface or will be spaced apart by at least a full design rule compliant spacing amount.

Figure 3B:
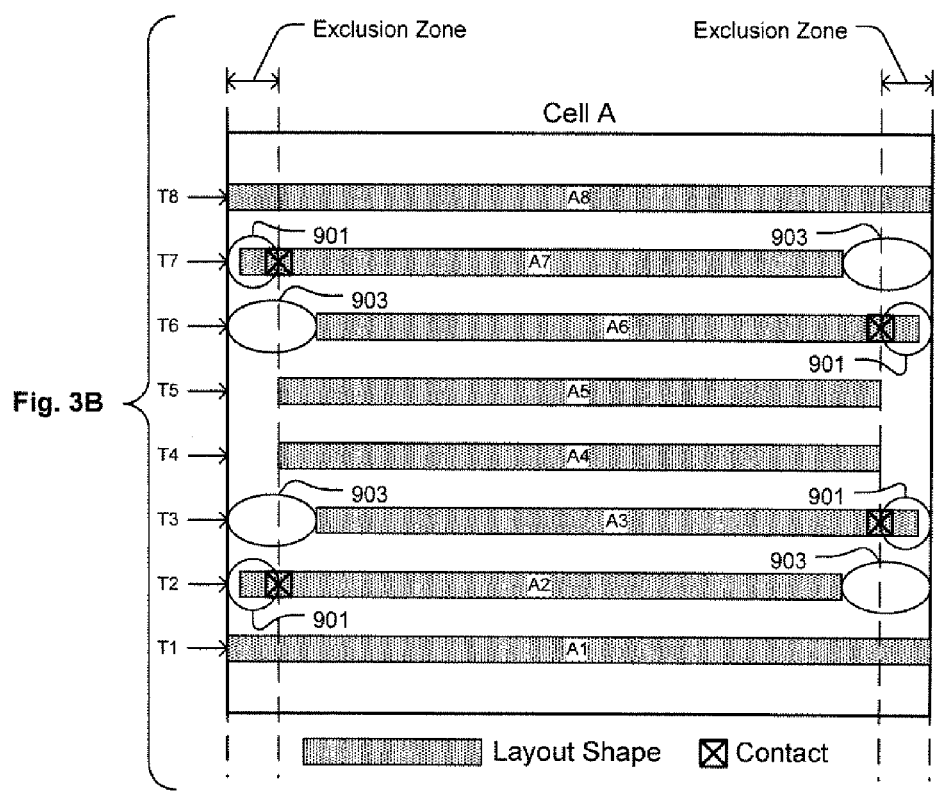
FIG. 3B shows a variation of the Cell A of FIG. 3A, in which certain layout shapes are allowed to encroach into the design rule distance buffer at the left or right cell boundaries, in accordance with one embodiment of the present invention.

Cell boundary encroachment techniques are disclosed herein to optimize cell area utilization by providing a systematic method for allowing encroachment of non-continuous layout shapes into the design rule distance buffer at the cell boundary, while preserving global shape-to-shape design rule spacing integrity. FIG. 3B shows a variation of the Cell A of FIG. 3A, in which certain layout shapes A2, A3, A6, and A7 are allowed to encroach into the design rule distance buffer at the left or right cell boundaries, in accordance with one embodiment of the present invention. Specifically, each of layout shapes A2 and A7 are defined to encroach within the design rule distance buffer at the left boundary of Cell A, as indicated by encroachment regions 901, with corresponding spacing allowance regions 903 at the opposite ends of the respective tracks upon which layout shapes A2 and A7 are placed. Each of layout shapes A3 and A6 are defined to encroach within the design rule distance buffer at the right boundary of the cell as indicated by encroachment regions 901, with corresponding spacing allowance regions 903 at the opposite ends of the respective tracks upon which layout shapes A3 and A6 are placed.

A boundary encroachment specification of a given track in a given cell level is defined by which end of the given track, if any, allows for layout shape encroachment within the design rule distance buffer at the cell boundary, and which end of the given track, if any, requires a spacing allowance region at the cell boundary. With regard to Cell A of FIG. 3B, the boundary encroachment specification of each track T1-T8 is as follows:

Track T1: No encroachment allowance.
Track T2: Left side encroachment region. Right side spacing allowance region.
Track T3: Right side encroachment region. Left side spacing allowance region.
Track T4: No encroachment allowance.
Track T5: No encroachment allowance.
Track T6: Right side encroachment allowance. Left side spacing allowance region.
Track T7: Left side encroachment region. Right side spacing allowance region.
Track T8: No encroachment allowance.

If each cell in a cell library is defined according to a common boundary encroachment specification, or includes layout shape-to-cell boundary spacings of at least the same size as the common boundary encroachment specification for each track, then the cells within the cell library can be placed next to each other in a compatible manner so as to comply with global shape-to-shape design rule separation requirements. For example, in one exemplary embodiment, each cell in a cell library is defined based on a left boundary encroachment specification and a complimentary right boundary encroachment specification. The left boundary encroachment specification will identify which tracks allow for layout shape encroachment within the design rule distance buffer at the left boundary of the cell, and which tracks require a spacing allowance region between a nearest layout shape and the left boundary of the cell.

Similarly, the right boundary encroachment specification will identify which tracks allow for layout shape encroachment within the design rule distance buffer at the right boundary of the cell, and which tracks require a spacing allowance region between a nearest layout shape and the right boundary of the cell. In this embodiment, if the boundary encroachment specification allows for encroachment of a given layout shape within the design rule distance buffer at the cell boundary of a given track, then actual layout shape encroachment at the cell boundary of the given track is allowed but not required. However, in this embodiment, if the boundary encroachment specification identifies a spacing allowance region at the cell boundary of a given track, then the spacing allowance region at the cell boundary of the given track is required.

Figure 4A:
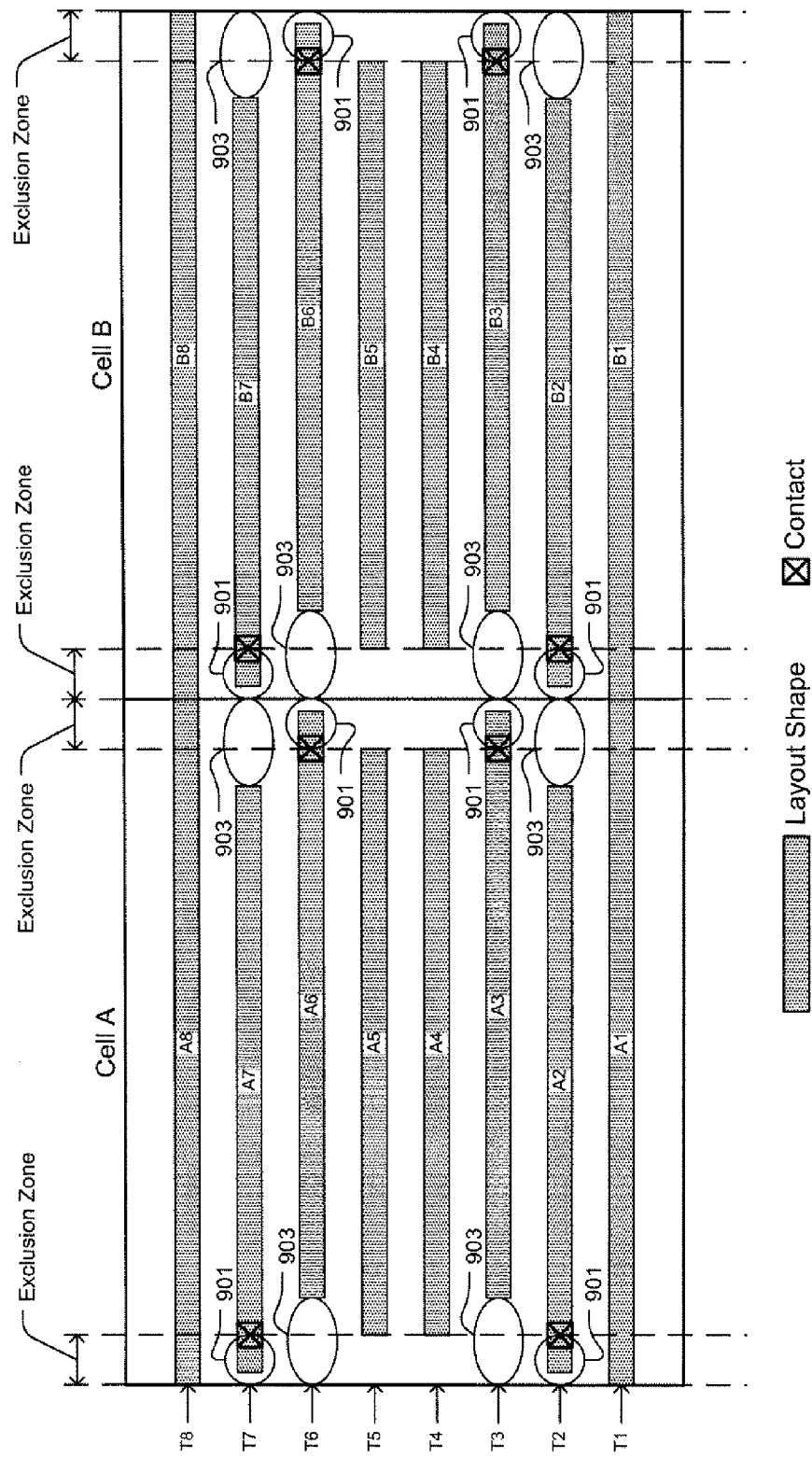
FIG. 4A shows an example of two cells (Cell A and Cell B) defined in accordance with the common boundary encroachment specification, as described above with regard to FIG. 3B, in accordance with one embodiment of the present invention.
Figure 4B:
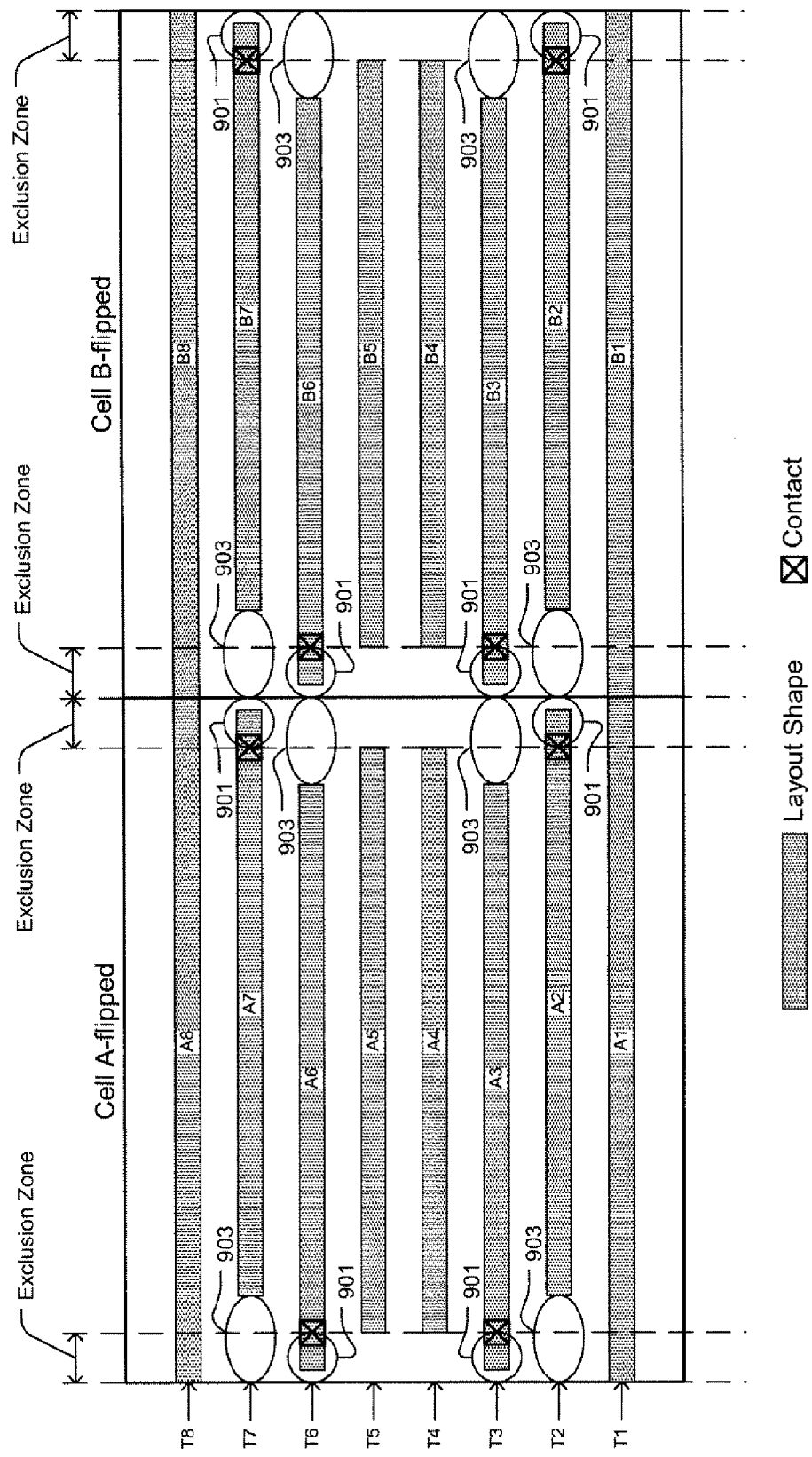
FIG. 4B shows flipped versions of Cell A and Cell B placed next to each other, in accordance with one embodiment of the present invention.

FIG. 4A shows an example of two cells (Cell A and Cell B) defined in accordance with the common boundary encroachment specification, as described above with regard to FIG. 3B, in accordance with one embodiment of the present invention. The spacing allowance regions 903 located at the right boundary of Cell A compliment the encroachment regions 901 at the left boundary of Cell B. Similarly, the spacing allowance regions 903 located at the left boundary of Cell B compliment the encroachment regions 901 at the right boundary of Cell A. Therefore, layout shapes B2 and B7 can encroach within the design rule distance buffer at the left boundary of Cell B and still satisfy the global shape-to-shape design rule spacing requirement relative to layout shapes A2 and A7, respectively. Similarly, layout shapes A3 and A6 can encroach within the design rule distance buffer at the right boundary of Cell A and still satisfy the global shape-to-shape design rule separation requirement relative to layout shapes B3 and B6, respectively. Cells can also be flipped as necessary to match encroachment regions 901 to spacing allowance regions 903. For example, FIG. 4B shows flipped versions of Cell A and Cell B placed next to each other, in accordance with one embodiment of the present invention.

In an extension of the above-described embodiment, the cell library can also include one or more cells which implement a mirrored encroachment specification in which both the left and right boundaries of the cell have the same boundary encroachment specification. Cells that implement the mirrored encroachment specification are referred to herein as "mirror cells." In this embodiment, to ensure full cell placement compatibility, two variations of each mirror cell are defined within the cell library. The first variation of a mirror cell applies the left common boundary encroachment specification to both the left and right boundaries of the mirror cell. The second variation of the mirror cell applies the right common boundary encroachment specification to both the left and right boundaries of the mirror cell.

Figure 5A:
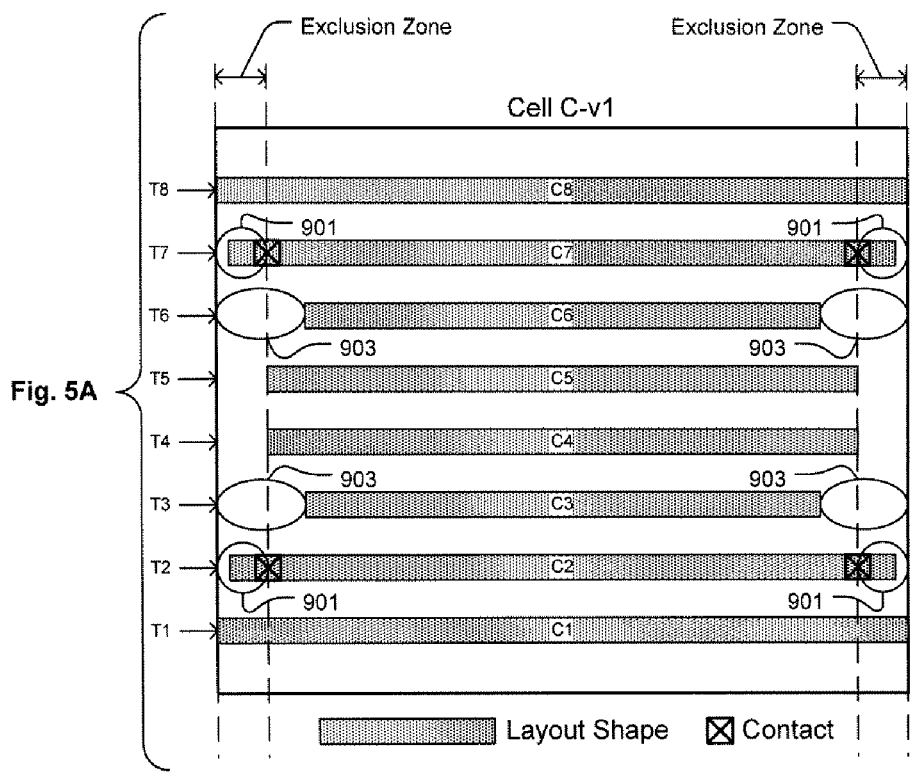
FIG. 5A shows a first variation of a mirror cell (Cell C-v1) in which the left common boundary encroachment specification, as shown at the left boundary of Cell A of FIG. 3B, is applied to both the left and right boundaries of the mirror cell (Cell C-v1), in accordance with one embodiment of the present invention.
Figure 5B:
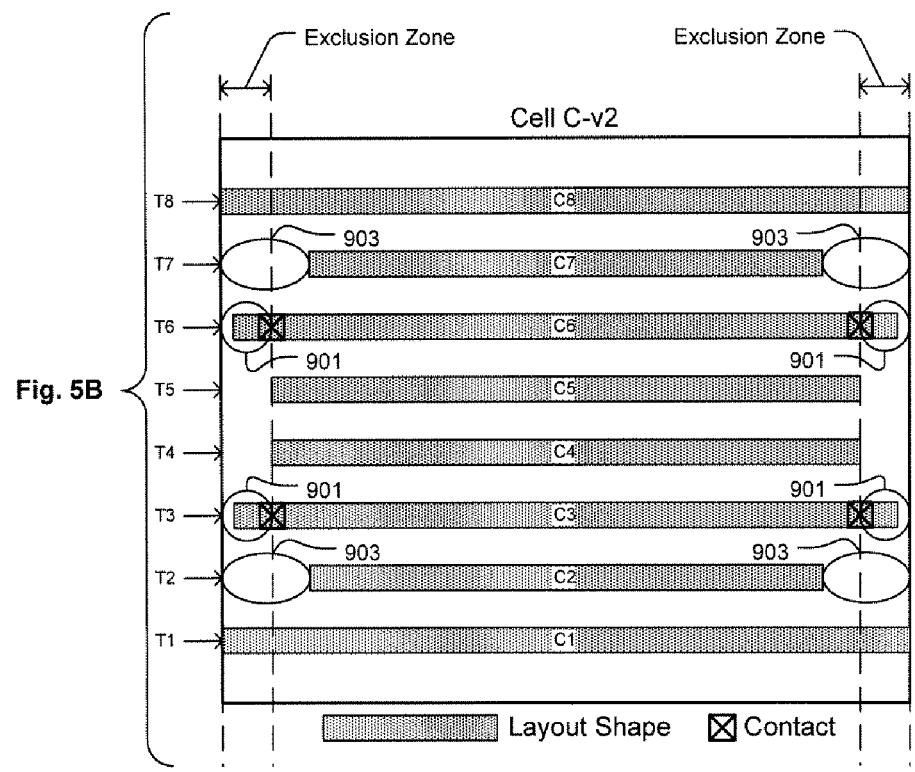
FIG. 5B shows a second variation of the mirror cell (Cell C-v2) in which the right common boundary encroachment specification, as shown at the right boundary in Cell A of FIG. 3B, is applied to both the left and right boundaries of the mirror cell (Cell C-v2), in accordance with one embodiment of the present invention.

FIG. 5A shows a first variation of a mirror cell (Cell C-v1) in which the left common boundary encroachment specification, as shown at the left boundary of Cell A of FIG. 3B, is applied to both the left and right boundaries of the mirror cell (Cell C-v1), in accordance with one embodiment of the present invention. FIG. 5B shows a second variation of the mirror cell (Cell C-v2) in which the right common boundary encroachment specification, as shown at the right boundary in Cell A of FIG. 3B, is applied to both the left and right boundaries of the mirror cell (Cell C-v2), in accordance with one embodiment of the present invention.

Figure 6A:
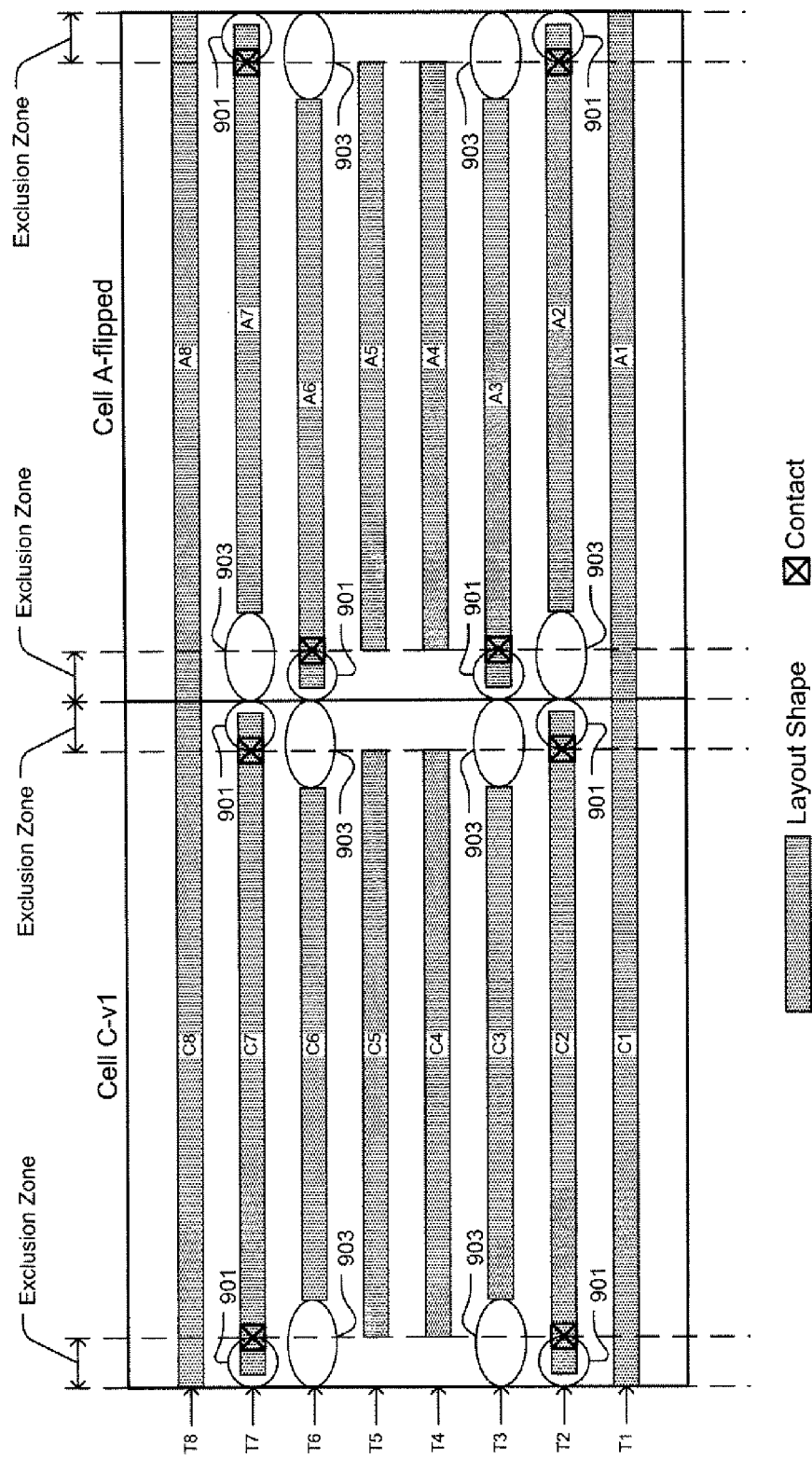
FIG. 6A shows Cell A-flipped placed to the right of Cell C-v1, in accordance with one embodiment of the present invention.
Figure 6B:
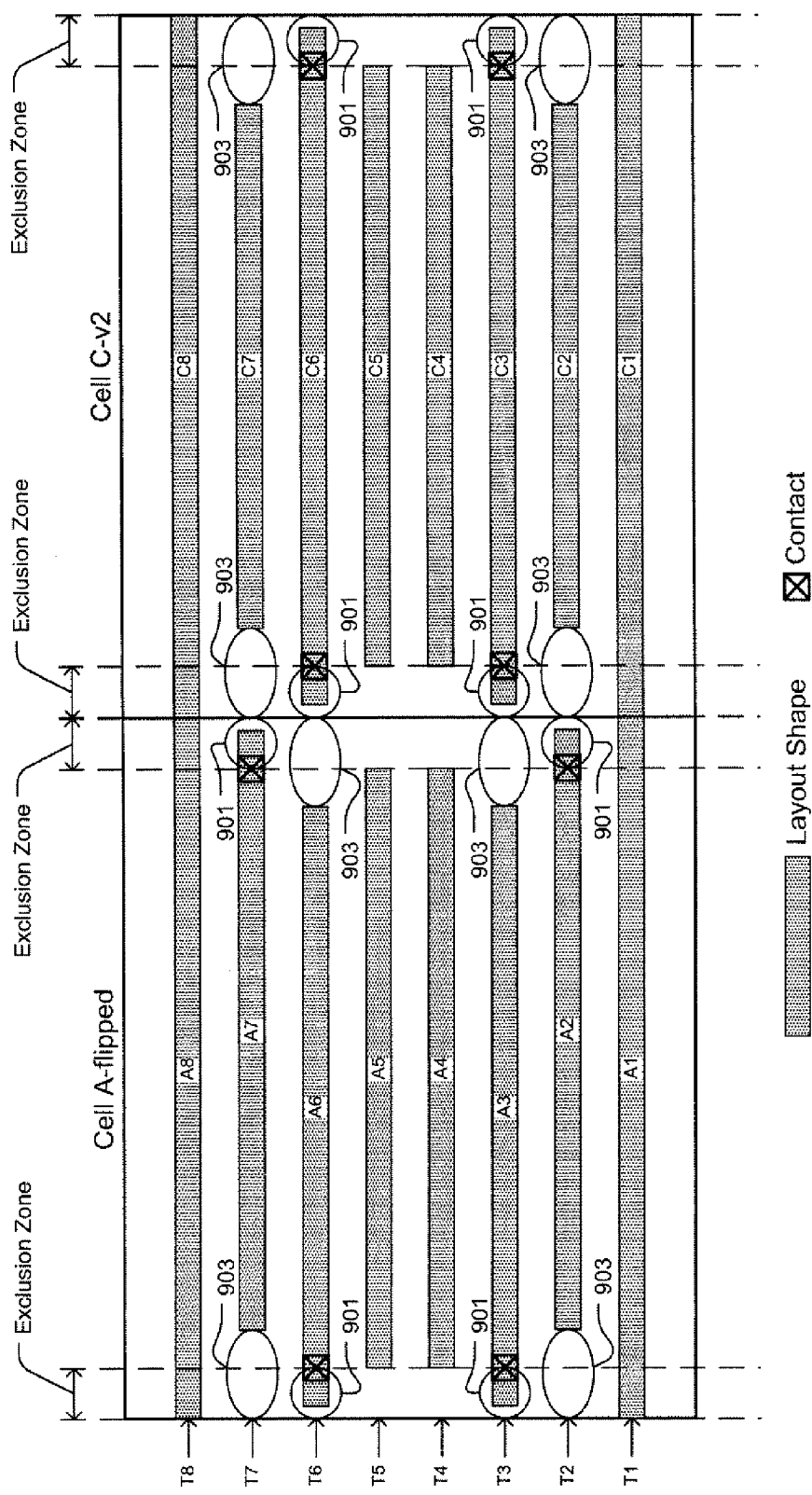
FIG. 6B shows Cell C-v2 placed to the right of Cell A-flipped, in accordance with one embodiment of the present invention.

By having both variations of the mirror cell in the cell library, the mirror cell can be placed next to any other cell that complies with the common boundary encroachment specification. For example, to implement left-to-right placement of Cells C, A, C, the cell placement can be done as C-v1, Cell A-flipped, C-v2. FIG. 6A shows Cell A-flipped placed to the right of Cell C-v1, in accordance with one embodiment of the present invention. FIG. 6B shows Cell C-v2 placed to the right of Cell A-flipped, in accordance with one embodiment of the present invention.

Figure 7A:
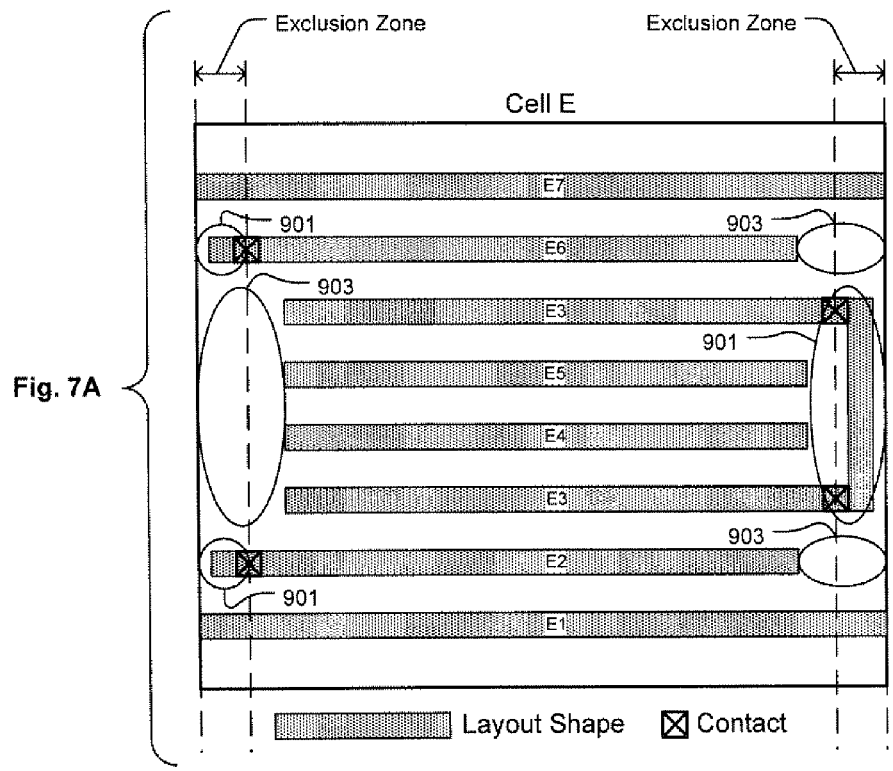
FIG. 7A shows an example of a cell (Cell E) that includes a two-dimensionally varying feature E3 and a number of linear-shaped features, in accordance with one embodiment of the present invention.

Although the exemplary embodiments of FIGS. 3A through 6B show linear-shaped layout features which may correspond to the dynamic array architecture, it should be understood that the cell boundary encroachment techniques disclosed herein are not necessarily limited to use with the dynamic array architecture. For example, FIG. 7A shows an example of a cell (Cell E) that includes a two-dimensionally varying feature E3 and a number of linear-shaped features E1-E2, E4-E5, E6-E7, in accordance with one embodiment of the present invention. The two-dimensionally varying feature E3 extends into encroachment region 901 at the right boundary of Cell E. Also, Cell E includes a spacing allowance region 903 located at the left boundary to complement the encroachment region 901 at the right boundary of Cell E.

Figure 7B:
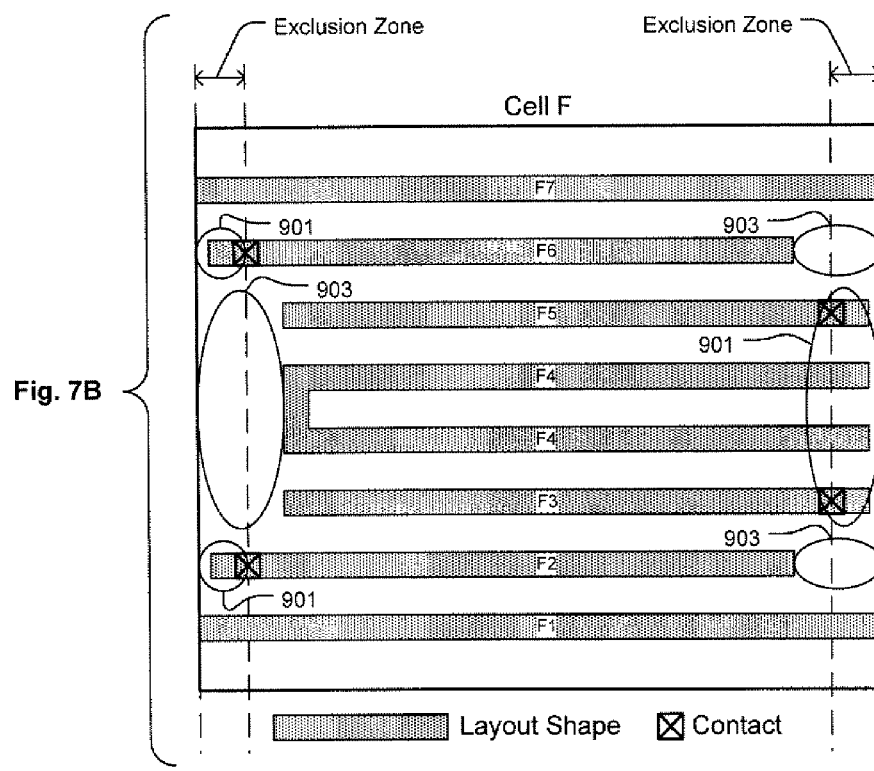
FIG. 7B shows another example cell (Cell F) that includes a two-dimensionally varying feature F4 and a number of linear-shaped features, in accordance with one embodiment of the present invention.

FIG. 7B shows another example cell (Cell F) that includes a two-dimensionally varying feature F4 and a number of linear-shaped features F1-F3 and F5-F7, in accordance with one embodiment of the present invention. The two-dimensionally varying feature F4 and the linear-shaped features F3 and F6 extend into encroachment region 901 at the right boundary of Cell F. Also, Cell F includes a spacing allowance region 903 located at the left boundary to complement the encroachment area 901 at the right boundary of Cell F. Therefore, Cells E and F have compatible boundary encroachment specifications, such that Cells E and F can be placed side-by-side.

Figure 7C:
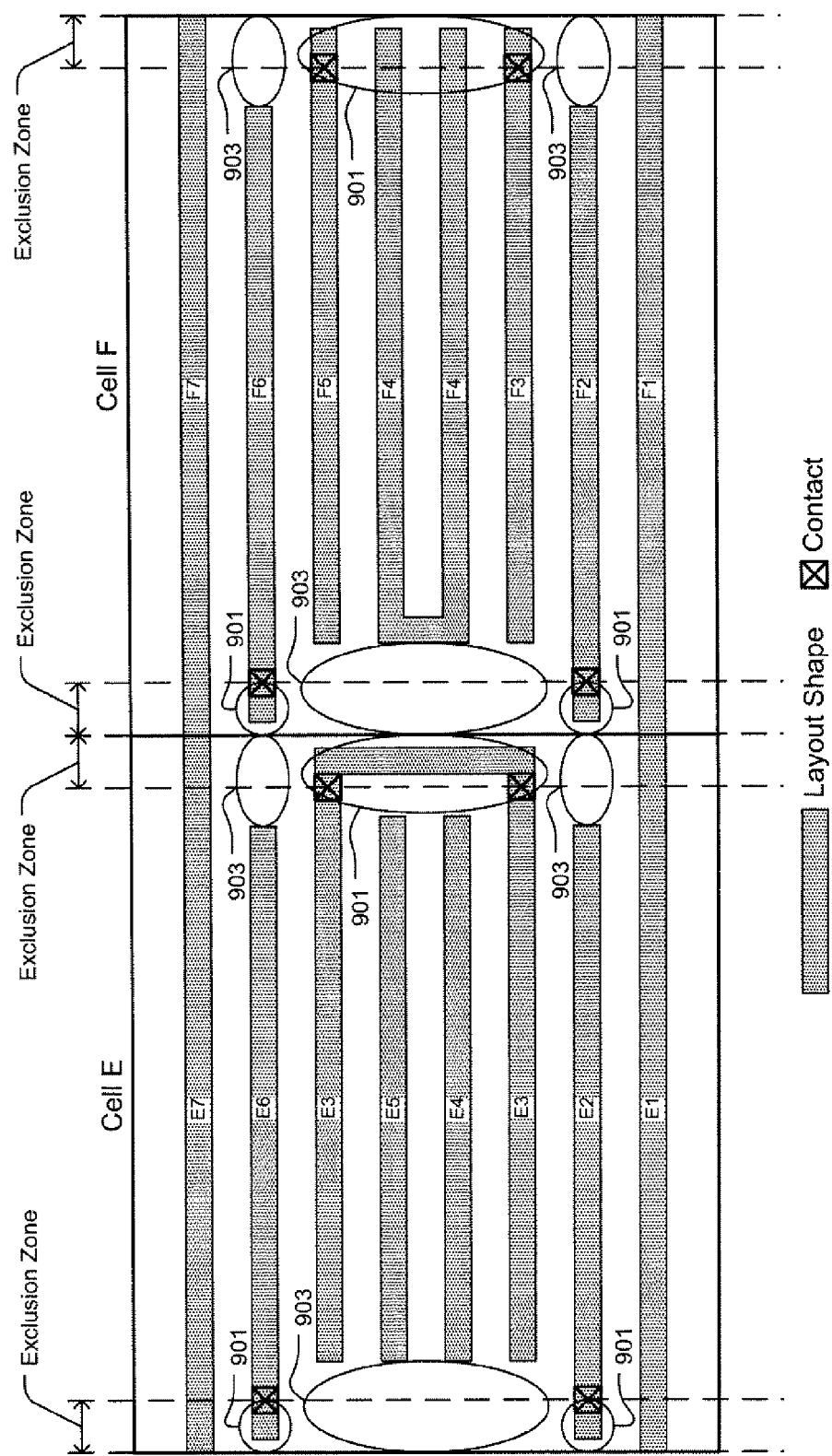
FIG. 7C shows side-by-side placement of Cells E and F of FIGS. 7A and 7B, respectively, in accordance with one embodiment of the present invention.

FIG. 7C shows side-by-side placement of Cells E and F of FIGS. 7A and 7B, respectively, in accordance with one embodiment of the present invention. The spacing allowance regions 903 located at the left boundary of Cell F compliments the encroachment region 901 at the right boundary of Cell E. Similarly, the spacing allowance regions 903 located at the right boundary of Cell E complement the encroachment regions 901 at the left boundary of Cell F. Therefore, the two-dimensionally varying layout shapes E3 can encroach within the design rule distance buffer at the right boundary of Cell E and still satisfy the global shape-to-shape design rule separation requirement relative to layout shapes F3, F4, and F5. Similarly, layout shapes F2 and F6 can encroach within the design rule distance buffer at the left boundary of Cell F and still satisfy the global shape-to-shape design rule separation requirement relative to layout shapes E2 and E6, respectively.

Figure 8:
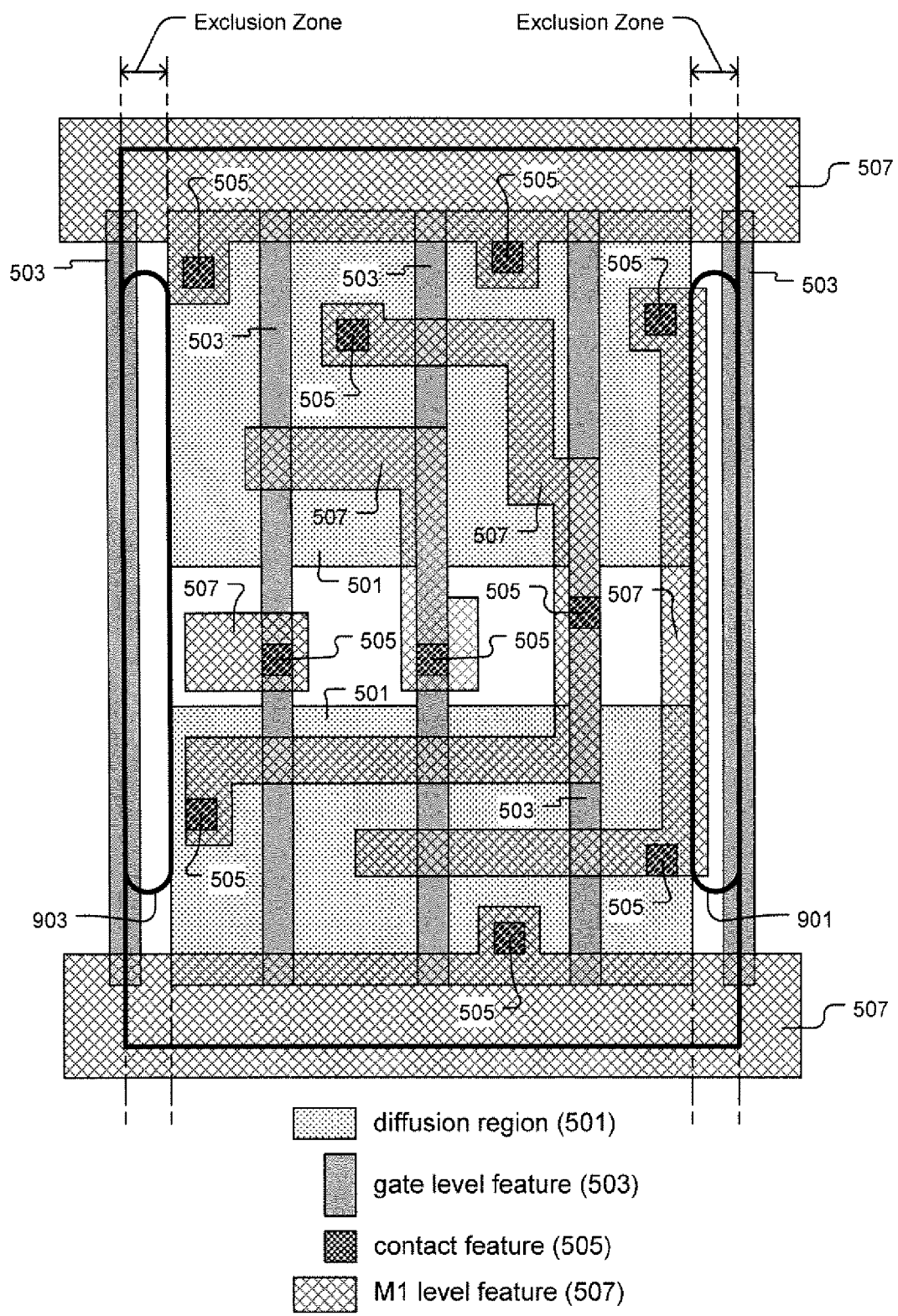
FIG. 8 shows an example cell layout for an AND logic circuit that implements the cell boundary encroachment techniques disclosed herein, in accordance with one embodiment of the present invention.

FIG. 8 shows an example cell layout for an AND logic circuit that implements the cell boundary encroachment techniques disclosed herein, in accordance with one embodiment of the present invention. The AND cell layout of FIG. 8 includes complementary (n-type and p-type) diffusion regions 501, gate electrode level features 503, contact features 505, and metal 1 (M1) level features 507. The gate electrode level layout includes gate electrode level features 503 that overlap each of the left and right cell boundaries. Also, the M1 level includes an M1 level feature that encroaches within the encroachment region 901 at the right boundary of the cell. The M1 level also includes a spacing allowance region 903 at the left boundary of the cell. It should also be appreciated that a mirrored version of the AND cell can be generated by flipping each layout of the cell about a centerline parallel to and equidistant between the left and right cell boundaries. The AND cell of FIG. 8 is one example of a logic cell implementation utilizing the cell boundary encroachment techniques disclosed herein. It should be understood that essentially any other cell defined to perform essentially any logic function can be implemented utilizing the cell boundary encroachment techniques disclosed herein.

It should be understood that the cell layouts presented in FIGS. 3A through 8 are provided by way of example only, and in no way limit the scope of the cell boundary encroachment techniques disclosed herein. For instance, any cell that utilizes the cell boundary encroachment techniques disclosed herein may have more or less tracks than shown in the examples herein. Also, a given common boundary encroachment specification can be defined in essentially any manner. Therefore, the specific tracks which include encroachment regions 901 and spacing allowance regions 903 can differ from what is shown by way of example in the cells of FIGS. 3A through 8. Also, any given cell that utilizes the cell boundary encroachment technique disclosed herein may incorporate layout shapes of varying size and shape beyond what is depicted in the examples herein.

Also, any given cell may utilize the cell boundary encroachment techniques disclosed herein on multiple cell levels. Cell boundary encroachment technique utilization within multiple cell levels of a given cell will be permutative in determining how many variations the given cell exists in the cell library. Additionally, different cells may utilize the cell boundary encroachment techniques on different cell levels. Moreover, some cells may not utilize the cell boundary encroachment techniques on a given level, but will comply with spacing allowance region requirements associated with the given level so as to be compatible for placement next to cells that do utilize the cell boundary encroachment techniques on the given level.

Utilizing the above-described cell boundary encroachment techniques, a semiconductor device is defined in accordance with one embodiment of the present invention. The semiconductor device includes a plurality of cells in which each cell has a respective outer cell boundary defined to circumscribe the cell in an orthogonal manner, i.e., with cell boundary segments extending at right angles to each other. For example, each of the example cell layouts of FIGS. 3A through 8 include a respective outer cell boundary defined to circumscribe the cell in an orthogonal manner, e.g., as a rectangle. It should be understood, however, that a rectangular shaped outer cell boundary is not required. In other embodiments, a cell can have essentially any polygonal shaped outer boundary. Each cell within the semiconductor device includes circuitry for performing one or more logic functions. This circuitry includes a plurality of conductive features defined in one or more levels of the cell.

In the semiconductor device, one or more of the conductive features in at least one level of a given cell is an encroaching feature positioned to encroach by an encroachment distance into an exclusion zone defined within the cell about the outer boundary of the cell. The exclusion zone occupies an area within the cell defined by an exclusion distance extending perpendicularly inward into the cell from the cell outer boundaries. In one embodiment, the exclusion distance is defined by one-half of a design rule distance as measured perpendicularly inward into the given cell from a segment of the outer cell boundary. However, in other embodiments, the exclusion distance is defined by a fraction or multiple of the design rule distance other than one-half, as measured perpendicularly inward into the given cell from a segment of the outer cell boundary. In one embodiment, the encroachment distance of the encroaching feature extends from a position corresponding to the inward extent of the exclusion distance from the segment of the outer cell boundary adjacent to the encroaching region, to an outermost edge of the encroaching feature relative to an interior of the given cell.

In one embodiment, the level of the given cell having the encroaching feature is also defined to correspondingly include a spacing allowance region adjacent to a segment of the outer cell boundary located opposite the given cell from the segment of the outer cell boundary where the encroaching region exists. The spacing allowance region extends perpendicularly inward into the given cell from its corresponding segment of the outer cell boundary by a spacing allowance distance equal to at least the encroachment distance plus the exclusion distance. This spacing allowance region size ensures that when two cells are placed side-by-side such that the encroachment region is placed next to the spacing allowance region, the conductive features within the encroachment region will be spaced apart from other conductive features by at least a full design rule separation distance. It should be understood that the spacing allowance region within the level of the given cell does not include any conductive features.

Figure 11A:
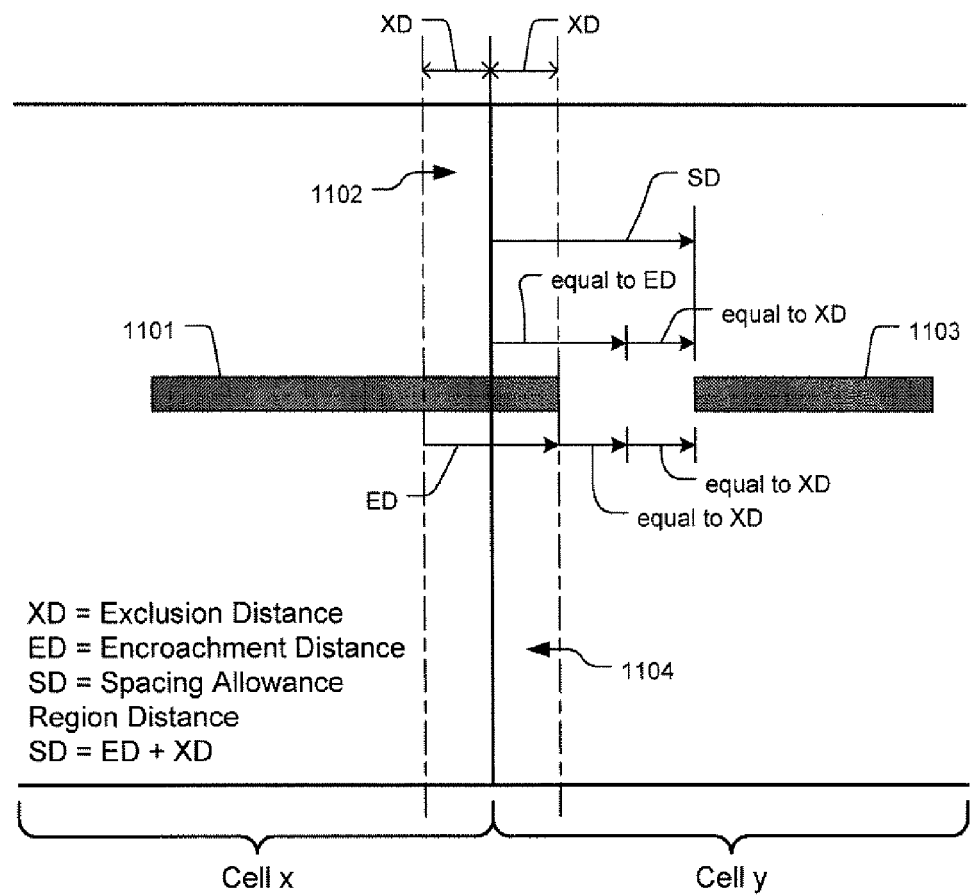
FIG. 11A shows an example of an interrelationship between the encroachment distance, exclusion distance, and spacing allowance region distance, with an encroachment feature that overlaps its cell boundary, in accordance with one embodiment of the present invention.

FIG. 11A shows an example of an interrelationship between the encroachment distance, exclusion distance, and spacing allowance region distance, with an encroachment feature 1101 that overlaps its cell boundary, in accordance with one embodiment of the present invention. Cells x and y are placed side-by-side such that their facing outer cell boundaries are aligned. That is to say the right cell boundary of Cell x is aligned with the left cell boundary of Cell y. Both Cell x and Cell y have exclusion zones 1102 and 1104, respectively, defined by an exclusion distance (XD). The encroaching feature 1101 extends into the exclusion zone 1102 of Cell x by an exclusion distance (ED), such that the encroaching feature 1101 overlaps the right cell boundary of Cell x. The corresponding spacing allowance region of Cell y had a distance of SD, which is equal to the sum of the encroaching distance (ED) plus the exclusion distance (XD). The neighboring feature 1103 in Cell y complies with the spacing allowance region, such that twice the exclusion distance (XD)

exists between the encroaching feature 1101 from Cell x and the neighboring feature 1103 in Cell y.

Figure 11B:
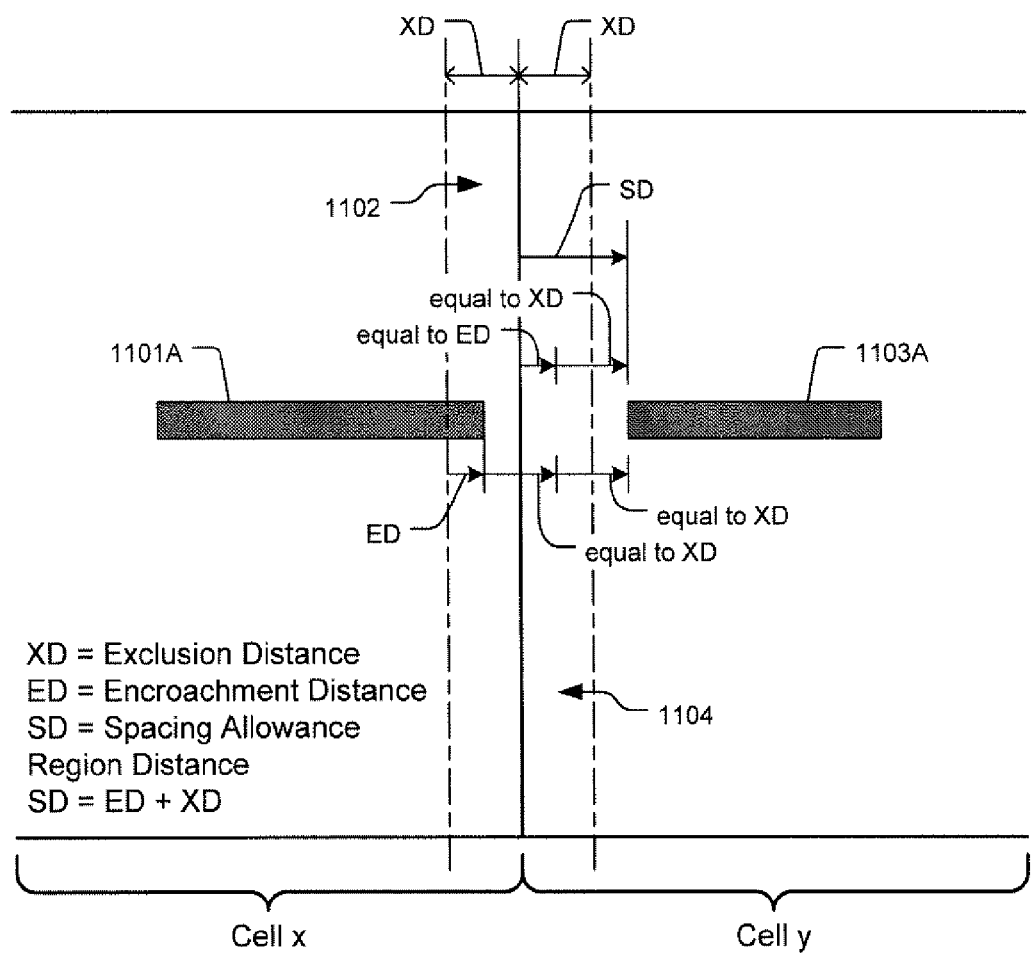
FIG. 11B shows a variation of FIG. 11A, with an encroachment feature that does not overlap its cell boundary, in accordance with one embodiment of the present invention.

FIG. 11B shows a variation of FIG. 11A, with an encroachment feature 1101A that does not overlap its cell boundary, in accordance with one embodiment of the present invention. The encroaching feature 1101A extends into the exclusion zone 1102 of Cell x by an exclusion distance (ED), such that the encroaching feature 1101A does not overlap the right cell boundary of Cell x. The corresponding spacing allowance region of Cell y had a distance of SD, which is equal to the sum of the encroaching distance (ED) plus the exclusion distance (XD). The neighboring feature 1103A in Cell y complies with the spacing allowance region, such that twice the exclusion distance (XD) exists between the encroaching feature 1101A from Cell x and the neighboring feature 1103A in Cell y.

In one embodiment, the encroaching feature within the encroachment region is a conductive feature within a gate electrode level of the given cell. In one version of this embodiment, the gate electrode level of the given cell is defined to include only linear-shaped conductive features positioned parallel to each other, such as in the dynamic array architecture. An example of this is shown by encroaching feature A6 in the example cell layout of FIG. 3B. However, in another version of this embodiment, the gate electrode level of the given cell is defined to include arbitrary shaped conductive features. In this case, the encroaching feature may include both a portion that is parallel to and a portion that is perpendicular to the segment of the outer cell boundary from which the encroachment region extends. An example of this is shown by encroaching feature E3 in the example cell layout of FIG. 7A.

In one embodiment, the encroaching feature is a conductive interconnect feature within an interconnect level of the given cell defined above a gate electrode level of the given cell. In one version of this embodiment, the interconnect level of the given cell is defined to include only linear-shaped conductive features positioned parallel to each other, such as in the dynamic array architecture. However, in another version of this embodiment, the interconnect level of the given cell is defined to include arbitrary shaped conductive features. In this case, the encroaching feature includes both a portion that is parallel to and a portion that is perpendicular to the segment of the outer cell boundary from which the encroachment region extends.

Also, in one embodiment, an outermost edge of the encroaching feature (relative to an interior of the given cell) is located inside of the outer cell boundary so as to be located inside of the given cell. However, in another embodiment, the outermost edge of the encroaching feature is located outside of the outer cell boundary, such that the encroaching feature overlaps the segment of the outer cell boundary from which the encroachment region extends, i.e., the reference segment of the outer cell boundary. For discussion purposes, this embodiment is referred to as an overlapping encroachment embodiment.

In one version of the overlapping encroachment embodiment, the encroaching feature is a linear-shaped conductive feature positioned parallel to the reference segment of the outer cell boundary, such that a width direction of the encroaching feature is perpendicular to the reference segment of the outer cell boundary. In one instance, a first extent of the encroaching feature in the width direction inside of the reference segment of the outer cell boundary is equal to a second extent of the encroaching feature in the width direction outside of the reference segment of the outer cell boundary. In another case, a first extent of the encroaching feature in the width direction inside of the reference segment of the outer cell boundary is different from a second extent of the encroaching feature in the width direction outside of the reference segment of the outer cell boundary.

In another version of the overlapping encroachment embodiment, the encroaching feature is a two-dimensionally shaped feature having one or more portions that extend parallel to the reference segment of the outer cell boundary and one or more portions that extend perpendicular to the reference segment of the outer cell boundary. In one instance, the encroaching portion of the two-dimensionally shaped encroaching feature includes both portions that extend parallel to and perpendicular to the reference segment of the outer cell boundary. In another instance, the encroaching portion of the two-dimensionally shaped encroaching feature may includes a portion that extends in a single direction either parallel to or perpendicular to the reference segment of the outer cell boundary. It should be understood that in various embodiments, the encroaching portion(s) of the encroaching feature may have essentially any shape depending on the particular layout of the cell.

In one example instance of the overlapping encroachment embodiment, the semiconductor device includes a first cell and a second cell, wherein the labels first and second are provided for identification purposes only and do not infer sequence or position. In this embodiment, the first cell includes an encroaching feature positioned to overlap a reference segment of an outer cell boundary of the first cell. Also, in this embodiment, the second cell includes an encroaching feature positioned to overlap a reference segment of an outer cell boundary of the second cell. The encroaching feature of the second cell is shaped to align with and overlap the encroaching feature of the first cell when the reference segments of the outer boundaries of the first and second cells are aligned. In this embodiment, the encroaching feature of the first cell and the encroaching feature of the second cell have a shared functionality such that a single instance of the overlapping encroaching features within the semiconductor device provides the shared functionality for both the first and second cells, when the first and second cells are placed such that their respective outer boundary reference segments are aligned.

Also, in one embodiment, the semiconductor chip includes mirrored versions of one or more cells. In this embodiment, a given cell and its mirrored version each have a common centerline defined parallel to and equidistant between two opposing segments of the outer cell boundary, e.g., between left and right segments of the outer cell boundary. In this embodiment, conductive features within the mirrored version of the given cell respectively correspond to conductive features within the given cell having been flipped about the common centerline.

In one embodiment, at least one instance of a given cell is defined on the semiconductor chip in accordance with any one of multiple versions of the given cell or combination thereof. The multiple versions of the given cell include:

a first version of the given cell having an encroachment region defined within a particular cell level adjacent to a first segment of the outer cell boundary and a spacing allowance region defined within the particular cell level adjacent to a second segment of the outer cell boundary located opposite the given cell from the first segment, a second version of the given cell having the encroachment region defined within the particular cell level adjacent to both the first and second segments of the outer cell boundary, and a third version of the given cell having the spacing allowance region defined within the particular cell level adjacent to both the first and second segments of the outer cell boundary.

Use of the labels first and second with regard to segments of the outer cell boundary are provided for reference purposes only and do not infer sequence or position. In this embodiment, the encroachment region is defined as a peripheral region of the particular cell level of the given cell within which at least one encroaching feature is positioned to encroach by an encroachment distance into an exclusion zone. As previously mentioned, the exclusion zone occupies the area within the cell defined by the exclusion distance extending perpendicularly inward into the cell from the cell outer boundaries.

The encroachment distance extends from a position corresponding to the inward extent of the exclusion distance from the segment of the outer cell boundary adjacent to the encroaching region, to an outermost edge of the encroaching feature relative to an interior of the given cell. Also, in this embodiment, the spacing allowance region is defined to extend perpendicularly inward into the given cell from the outer cell boundary by a spacing allowance distance equal to at least the encroachment distance plus the exclusion distance. The spacing allowance region within the particular cell level does not include any conductive features.

Also, in this embodiment, the multiple versions of the given cell include mirrored versions of each of the first, second, and third versions, i.e., non-mirrored versions, of the given cell, as described above. Each non-mirrored version of the given cell and its corresponding mirrored version both have a common centerline defined parallel to and equidistant between the first and second segments of the outer cell boundary. Conductive features within each mirrored version of the given cell respectively correspond to conductive features within the corresponding non-mirrored version of the given cell having been flipped about the common centerline.

In another embodiment, the cell boundary encroachment techniques described herein can be represented in a cell library stored in a digital format on a computer readable storage medium. The cell library includes one or more layouts of a cell. The cell has an outer cell boundary defined to circumscribe the cell in an orthogonal manner. The cell is also defined to include circuitry for performing one or more logic functions. Each layout for the cell includes layout shapes for conductive features in one or more levels of the cell. A first layout of the cell has an encroachment region defined within a given level of the cell adjacent to a first segment of the outer cell boundary. The encroachment region includes at least one encroaching layout shape positioned to encroach by an encroachment distance into an exclusion zone. The exclusion zone occupies an area within the cell defined by an exclusion distance extending perpendicularly inward into the cell from the cell outer boundaries. The encroachment distance extends from a position corresponding to the inward extent of the exclusion distance from the segment of the outer cell boundary adjacent to the encroaching region, to an outermost edge of the encroaching layout shape relative to an interior of the given cell.

The first layout of the cell also includes a spacing allowance region defined within the given level of the cell adjacent to a second segment of the outer cell boundary located opposite the cell from the first segment of the outer cell boundary. The spacing allowance region extends perpendicularly inward into the cell from the second segment of the outer cell boundary by a spacing allowance distance equal to at least the encroachment distance of the encroachment region plus the exclusion distance. The spacing allowance region in the cell level does not include any layout shapes.

In one embodiment, the cell library also includes a mirrored version of the first layout of the cell. The first layout of the cell and its mirrored version both have a common centerline defined parallel to and equidistant between the first and second segments of the outer cell boundary. Conductive features within the mirrored version of the first layout of the cell correspond to conductive features within the first layout of the cell having been flipped about the common centerline.

In one embodiment, the cell library also includes a second layout of the cell in which the cell level has a first encroachment region defined adjacent to the first segment of the outer cell boundary, and a second encroachment region defined adjacent to the second segment of the outer cell boundary located opposite the cell from the first segment of the outer cell boundary. In this embodiment, each of the first and second encroachment regions includes at least one encroaching layout shape positioned to encroach by a respective encroachment distance into a corresponding exclusion zone.

In one embodiment, the cell library also includes a mirrored version of the second layout of the cell. The second layout of the cell and its mirrored version both have a common centerline defined parallel to and equidistant between the first and second segments of the outer cell boundary. Conductive features within the mirrored version of the second layout of the cell correspond to conductive features within the second layout of the cell having been flipped about the common centerline.

In one embodiment, the cell library also includes a third layout of the cell in which the cell level has a first spacing allowance region defined adjacent to the first segment of the outer cell boundary, and a second spacing allowance region defined adjacent to the second segment of the outer cell boundary located opposite the cell from the first segment of the outer cell boundary. In this embodiment, the first spacing allowance region extends perpendicularly inward into the cell from the first segment of the outer cell boundary by a first spacing allowance distance equal to at least the encroachment distance of the second encroachment region of the second cell layout plus the exclusion distance. Also, the second spacing allowance region extends perpendicularly inward into the cell from the second segment of the outer cell boundary by a second spacing allowance distance equal to at least the encroachment distance of the first encroachment region of the first and second layouts plus the exclusion distance. Each of the first and second spacing allowance regions in the cell level does not include any layout shapes.

In one embodiment, the cell library also includes a mirrored version of the third layout of the cell. The third layout of the cell and its mirrored version both have a common centerline defined parallel to and equidistant between the first and second segments of the outer cell boundary. Conductive features within the mirrored version of the third layout of the cell correspond to conductive features within the third layout of the cell having been flipped about the common centerline.

The foregoing description of the cell boundary encroachment techniques have been provided primarily within the context of a given cell or a given pair of interfacing cells, i.e., adjacently placed cells. In addition to the principles of the cell boundary encroachment techniques, as described above, it should be understood that additional considerations may be made when implementing the cell boundary encroachment techniques across a cell library.

Specifically, within the cell library, there should be at least one version of each cell that has a boundary specification defined to accommodate the most aggressive boundary encroachments among the cells in the cell library. The most aggressive boundary encroachments are those that have the largest encroachment distance. For discussion purposes, consider an example cell library that includes multiple cells, including a Cell J and a Cell K, among others.

Figure 9A:
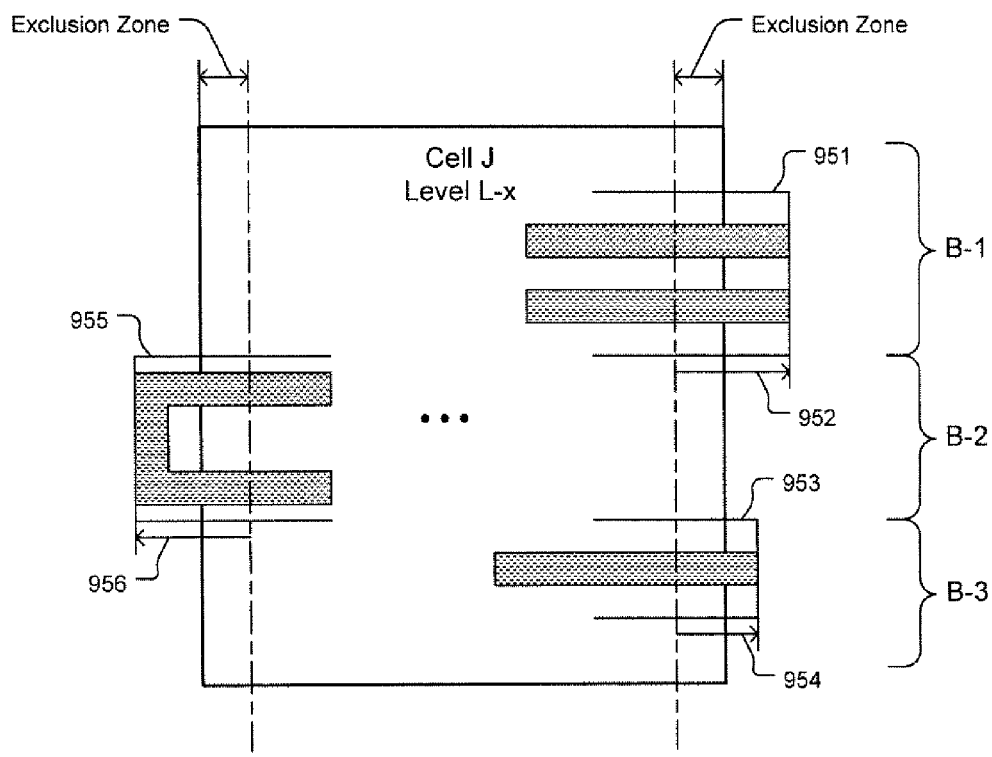
FIG. 9A shows a particular level L-x of the Cell J that has a right boundary encroachment specification defined by encroachment regions 951 and 953, in accordance with one embodiment of the present invention.

FIG. 9A shows a particular level L-x of the Cell J that has a right boundary encroachment specification defined by encroachment regions 951 and 953, in accordance with one embodiment of the present invention. The encroachment region 951 has an encroachment distance indicated by arrow 952. The encroachment region 953 has an encroachment distance indicated by arrow 954. And, the encroachment region 955 has an encroachment distance indicated by arrow 956. Cell J also has a left boundary encroachment specification defined by encroachment region 955. The encroachment region 955 has an encroachment distance indicated by arrow 956.

Figure 9B:
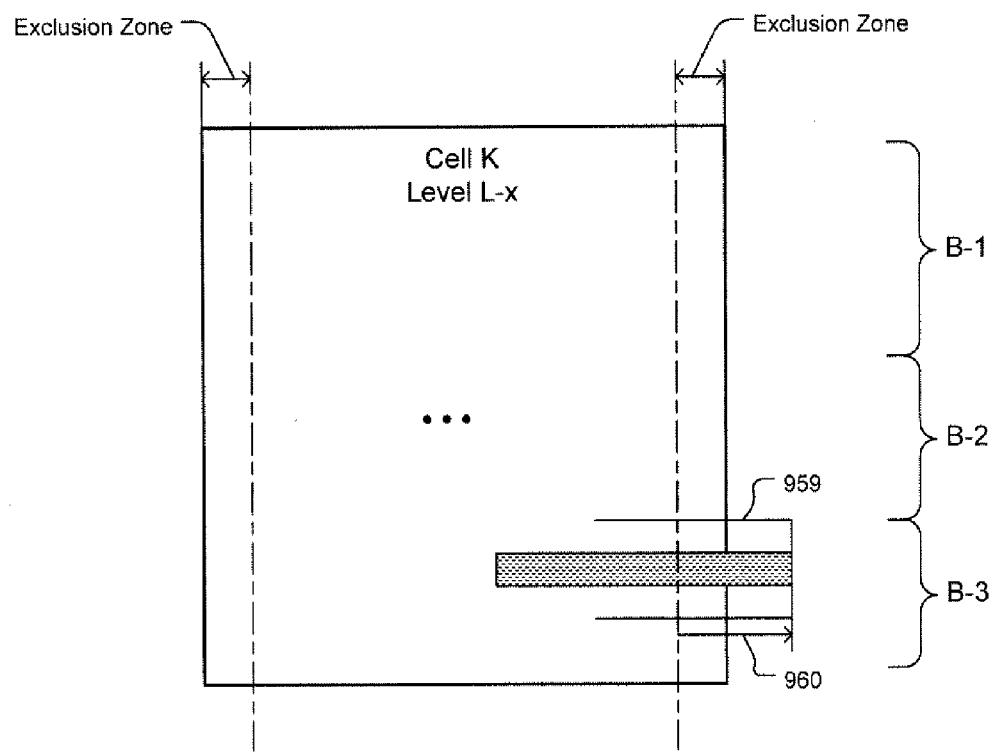
FIG. 9B shows the same particular level L-x of the Cell K that has a right boundary encroachment specification defined by an encroachment region 959, in accordance with one embodiment of the present invention.

FIG. 9B shows the same particular level L-x of the Cell K that has a right boundary encroachment specification defined by an encroachment region 959, in accordance with one embodiment of the present invention. The encroachment region 959 has an encroachment distance indicated by arrow 960.

For discussion purposes, consider that within level L-x within all the cells in the cell library, the encroachment distance 952 of encroachment region 951 of Cell J is the maximum encroachment distance at the cell boundary location B-1. Also, consider that the encroachment distance 956 of encroachment region 955 of Cell J is the maximum encroachment distance at the cell boundary location B-2. Also, consider that the encroachment distance 960 of encroachment region 959 of Cell K is the maximum encroachment distance at the cell boundary location B-3.

To ensure that the cells within the library can be placed next to each other without violating the design rule spacing requirement between adjacent conductive features, there should be a version of each cell within the cell library that has a level L-x layout with spacing allowance regions defined to accommodate the most aggressive boundary encroachments among the cells in the cell library. In the present example, the most aggressive boundary encroachments among the cells in the cell library within level L-x are those corresponding to encroachment regions 951 and 955 of Cell J, and the encroachment region 959 of Cell K. Therefore, in the present example, there should be a version of each cell within the cell library that has a level L-x layout with spacing allowance regions defined to accommodate the encroachment regions 951 and 955 of Cell J, and the encroachment region 959 of Cell K.

Figure 9C:
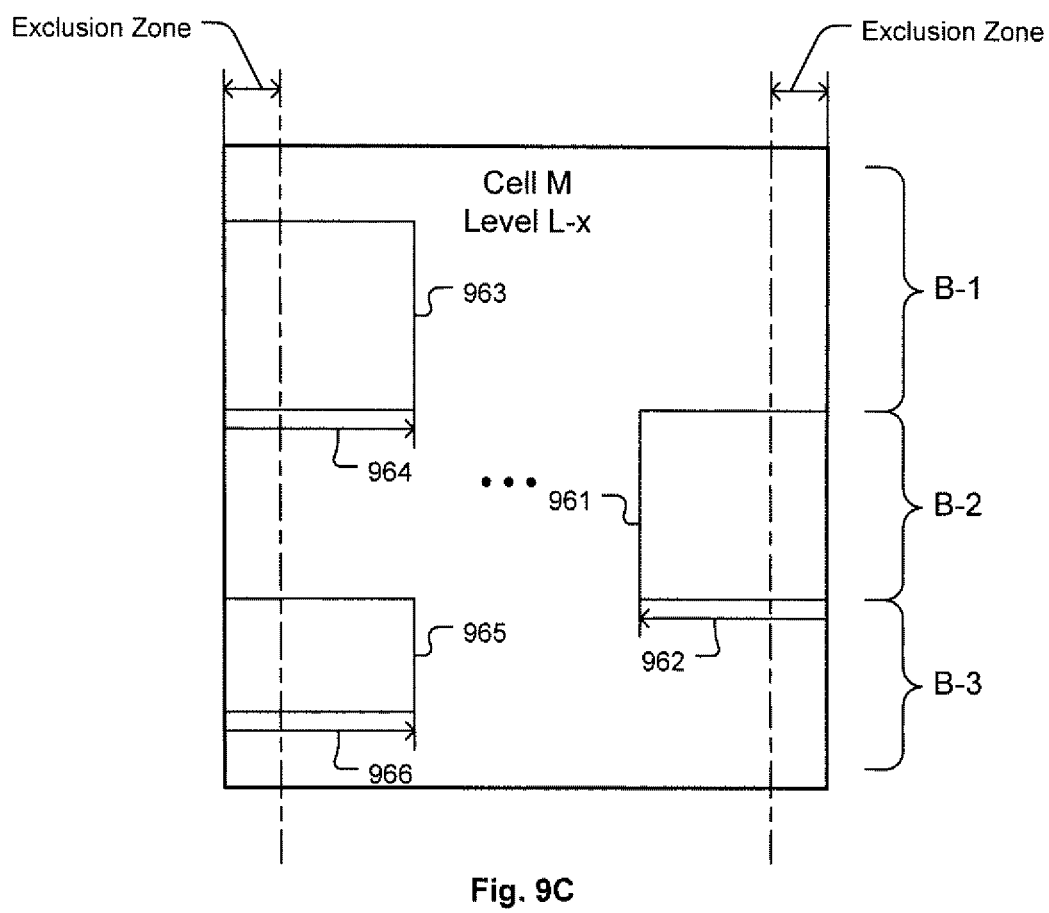
FIG. 9C shows a first version of a Cell M that includes spacing allowance regions 961, 963, and 965, in accordance with one embodiment of the present invention.

FIG. 9C shows a first version of a Cell M that includes spacing allowance regions 961, 963, and 965, in accordance with one embodiment of the present invention. The spacing allowance regions 961, 963, and 965 are defined to accommodate boundary encroachment regions 955, 951, and 953, respectively. The spacing allowance region 961 extends inward into the Cell M by a distance 962 equal to at least a sum of the encroachment distance 956 (of encroachment region 955 of Cell J) plus the exclusion distance of the exclusion zone. In this manner, the spacing allowance region 961 at boundary location B-2 accommodates the most aggressive encroachment region within the cell library at boundary location B-2.

The spacing allowance region 963 extends inward into the Cell M by a distance 964 equal to at least a sum of the encroachment distance 952 (of encroachment region 951 of Cell J) plus the exclusion distance of the exclusion zone. The spacing allowance region 965 extends inward into the Cell M by a distance 966 equal to at least a sum of the encroachment distance 960 (of encroachment region 959 of Cell K) plus the exclusion distance of the exclusion zone. In this manner, the spacing allowance regions 963 and 965 at boundary locations B-1 and B-3, respectively, accommodate the most aggressive encroachment regions within the cell library at boundary locations B-1 and B-3, respectively.

In one embodiment, cells are placed next to each other in a sequential manner. In this case, it may be acceptable for a cell to have a version that accommodates the most aggressive boundary encroachment specification on one side of the cell at a time. For instance, a second version of Cell M may be defined to have the spacing allowance region 961 on the right cell boundary, and not have the spacing allowance regions 963 and 965 on the left cell boundary. However, in this case, the second version of Cell M could not be the only version of Cell M in the cell library. In this case, their should be at least one other version of Cell M that includes the spacing allowance regions 963 and 965 on the left cell boundary. This at least one other version of Cell M could be satisfied by the first version of Cell M as shown in FIG. 9C. Or, the cell library could further include a third version of Cell M that includes the spacing allowance regions 963 and 965 on the left cell boundary, without the spacing allowance region 961 on the right cell boundary.

It should be understood that mirrored version of the cells within the cell library can be placed on the semiconductor chip. Therefore, a version of a cell having spacing allowance region(s) located on a right side of a cell can be mirrored, i.e., flipped, to have the same spacing allowance region(s) located on a left side of the cell, vice-versa. Also, it should be understood that multiple levels of a cell can have encroachment boundary specifications. The example described above with regard to FIGS. 9A-9C correspond to one level L-x of the cells within the cell library. When multiple cell levels include boundary encroachment specifications, the spacing allowance regions necessary to accommodate the most aggressive encroachment regions within each level of the cell are permutated on a cell level-by-cell level basis to generate multiple versions of each cell. This ensures that each cell within the cell library has a version that can accommodate any combination of encroachment regions across multiple cell levels.

In various embodiments, the cell boundary encroachment techniques disclosed herein can be used to facilitate implementation of either standard or non-standard cell designs. In one embodiment, cells can be defined to include a level in which layout features are defined to have a width size of odd number, such as 35 nm (nanometers) by way of example. With the odd numbered feature width size, it may not be possible to have a centered alignment of layout features on the cell boundaries. In other words, the encroachment distance of a layout feature on one side of the cell boundary may be different than the encroachment distance of another layout feature on the other side of the cell boundary.

Figure 10A:
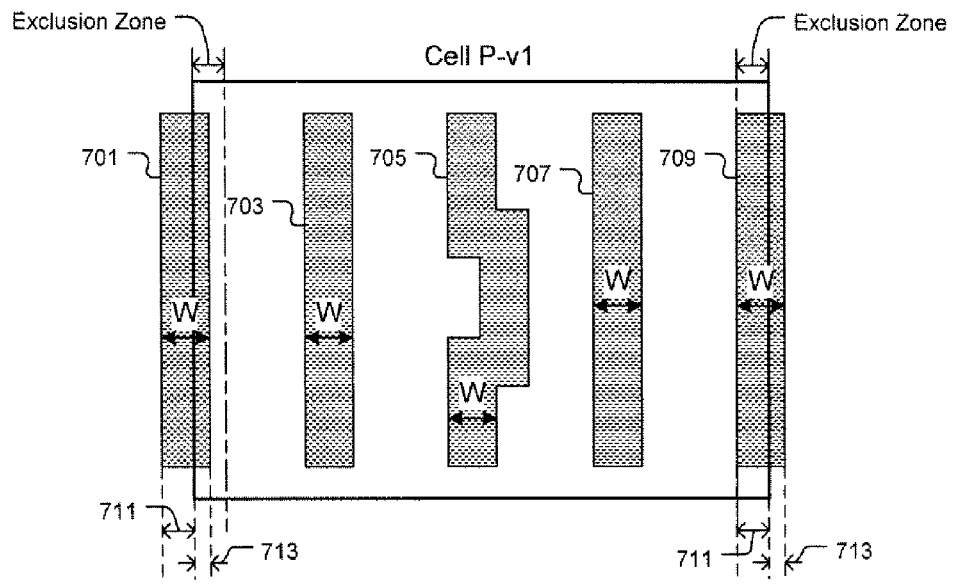
FIG. 10A shows a layout of a level of an example Cell P-v1, in which the layout features have a width size W of odd number, in accordance with one embodiment of the present invention.

For example, FIG. 10A shows a layout of a level of an example Cell P-v1, in which the layout features have a width size W of odd number, in accordance with one embodiment of the present invention. Specifically, each of layout features 701, 703, 705, 707, and 709 is defined to have the odd numbered width W. In this case, a fixed cell layout grid increment spacing may be sized such that the left and right cell boundaries cannot be centered on the encroaching layout shapes 701 and 709, respectively. Therefore, the layout feature 701 extends outside of the cell boundary by a distance 711, and extends inside of the cell boundary by a distance 713, where the distance 713 is less than the distance 711. Also, the layout feature 709 extends outside of the cell boundary by the distance 713, and extends inside of the cell boundary by the distance 711. By way of example, in the embodiment where the odd numbered feature width size is 35 nm, the larger distance 711 may correspond to 20 nm, and the smaller distance 713 may correspond to 15 nm. It should be understood, however, that these size values are not limited and that essentially any other size values may be utilized.

Figure 10B:
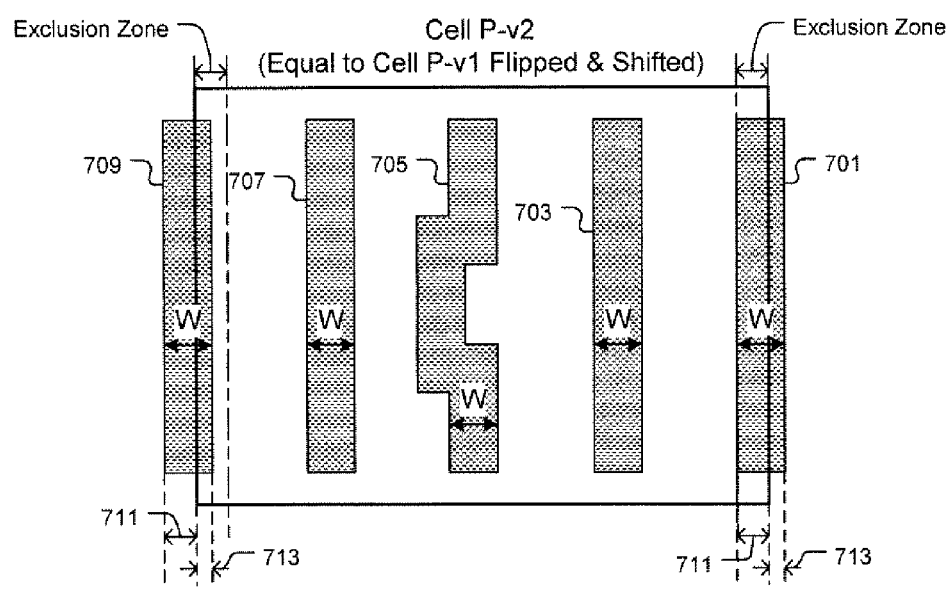
FIG. 10B shows a layout of a second version of Cell P (Cell P-v2), in which the cell is both flipped and shifted, in accordance with one embodiment of the present invention.

It can be seen that a simple flipping, i.e., mirroring, of Cell P-v1 does not enable placement of Cell P in a side-by-side manner. Therefore, another version of Cell P is generated to enable side-by-side placement. FIG. 10B shows a layout of a second version of Cell P (Cell P-v2), in which the cell is both flipped and shifted, in accordance with one embodiment of the present invention. Specifically, to arrive at the layout of Cell P-v2, the layout features within Cell P-v1 are flipped and then shifted to the left, such that the layout features 709 and 701 of Cell P-v2 will align with the layout features 709 and 701, respectively, of Cell P-v1 when Cells P-v1 and P-v2 are placed side-by-side with overlapping cell boundaries.

In one embodiment, the cell boundary encroachment techniques utilized to implement cells with feature width sizes of odd number, such as described in FIGS. 10A-10B, can be implemented across an entire cell library. In this embodiment, each cell in the library will have at least one flipped and shifted version to accommodate its side-by-side placement next to any other cell in the library. Also, it should be understood that the embodiments described with regard to FIGS. 10A-10B can be applied to essentially any cell level layout, such as a gate electrode level and/or an interconnect level defined above the gate electrode level.

In summary, it should be understood that the cell boundary encroachment techniques disclosed herein provide a systematic approach for allowing certain layout shapes to encroach within the design rule spacing buffer at a cell boundary, while ensuring that global shape-to-shape design rule separation requirements are satisfied when cells are placed next to each other. For any given cell level, the cell boundary encroachment techniques disclosed herein can be applied to left/right cell boundaries, top/bottom cell boundaries, or both left/right and top/bottom cell boundaries.

It should be understood that the cell boundary encroachment techniques disclosed herein can be implemented in a layout that is stored in a tangible form, such as in a digital format on a computer readable medium. For example, the layouts incorporating the cell boundary encroachment techniques disclosed herein can be stored in a layout data file of one or more cells, selectable from one or more libraries of cells. The layout data file can be formatted as a GDS II (Graphic Data System) database file, an OASIS (Open Artwork System Interchange Standard) database file, or any other type of data file format suitable for storing and communicating semiconductor device layouts. Also, multi-level layouts utilizing the cell boundary encroachment techniques can be included within a multi-level layout of a larger semiconductor device. The multi-level layout of the larger semiconductor device can also be stored in the form of a layout data file, such as those identified above.

Also, the invention described herein can be embodied as computer readable code on a computer readable medium. For example, the computer readable code can include the layout data file within which one or more layouts implementing the cell boundary encroachment techniques are stored. The computer readable code can also include program instructions for selecting one or more layout libraries and/or cells that include a layout utilizing the cell boundary encroachment techniques as defined therein. The layout libraries and/or cells can also be stored in a digital format on a computer readable medium.

The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the cell boundary encroachment embodiments as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A semiconductor device, comprising:
a plurality of cells, wherein each of the plurality of cells has a respective outer cell boundary defined to circumscribe the cell in an orthogonal manner, and wherein each of the plurality of cells includes circuitry for performing one or more logic functions, the circuitry including a plurality of conductive features defined in one or more levels of the cell,
wherein one or more of the conductive features in at least one level of a given cell is an encroaching feature positioned to encroach by an encroachment distance into an exclusion zone, wherein the exclusion zone occupies an area within the cell defined by an exclusion distance extending perpendicularly inward into the given cell from a first segment of the outer cell boundary, wherein the encroachment distance extends from a position corresponding to the inward extent of the exclusion distance from the first segment of the outer cell boundary, to an outermost edge of the encroaching feature relative to an interior of the given cell,
wherein the level of the given cell having the encroaching feature is also defined to correspondingly include a spacing allowance region adjacent to a second segment of the outer cell boundary located opposite the given cell from the first segment of the outer cell boundary, wherein the spacing allowance region extends perpendicularly inward into the given cell from the second segment of the outer cell boundary by a spacing allowance distance equal to at least the encroachment distance plus the exclusion distance, wherein the spacing allowance region within the level of the given cell does not include any conductive features.

2. A semiconductor device as recited in claim 1, wherein the encroaching feature is a conductive feature within a gate electrode level of the given cell.

3. A semiconductor device as recited in claim 2, wherein the gate electrode level of the given cell is defined to include only linear-shaped conductive features positioned parallel to each other.

4. A semiconductor device as recited in claim 2, wherein the gate electrode level of the given cell is defined to include arbitrary shaped conductive features, and wherein the encroaching feature includes both a portion that is parallel to the first segment of the outer cell boundary and a portion that is perpendicular to the first segment of the outer cell boundary.

5. A semiconductor device as recited in claim 1, wherein the encroaching feature is a conductive interconnect feature within an interconnect level of the given cell, wherein the interconnect level of the given cell is defined above a gate electrode level of the given cell.

6. A semiconductor device as recited in claim 5, wherein the interconnect level of the given cell is defined to include only linear-shaped conductive features positioned parallel to each other.

7. A semiconductor device as recited in claim 5, wherein the interconnect level of the given cell is defined to include arbitrary shaped conductive features, and wherein the encroaching feature includes both a portion that is parallel to the first segment of the outer cell boundary and a portion that is perpendicular to the first segment of the outer cell boundary.

8. A semiconductor device as recited in claim 1, wherein the outermost edge of the encroaching feature is located inside of the outer cell boundary so as to be located inside of the given cell.

9. A semiconductor device as recited in claim 1, wherein the outermost edge of the encroaching feature is located outside of the outer cell boundary, such that the encroaching feature overlaps the first segment of the outer cell boundary.

10. A semiconductor device as recited in claim 9, wherein the encroaching feature is a linear-shaped conductive feature positioned parallel to the first segment of the outer cell boundary, such that a width direction of the encroaching feature is perpendicular to the first segment of the outer cell boundary, and wherein a first extent of the encroaching feature in the width direction inside of the first segment of the outer cell boundary is equal to a second extent of the encroaching feature in the width direction outside of the first segment of the outer cell boundary.

11. A semiconductor device as recited in claim 9, wherein the encroaching feature is a linear-shaped conductive feature positioned parallel to the first segment of the outer cell boundary, such that a width direction of the encroaching feature is perpendicular to the first segment of the outer cell boundary, and wherein a first extent of the encroaching feature in the width direction inside of the first segment of the outer cell boundary is different from a second extent of the encroaching feature in the width direction outside of the first segment of the outer cell boundary.

12. A semiconductor device as recited in claim 11, wherein a width size of the encroaching feature as measured in the width direction is an odd number defined to cause the first extent of the encroaching feature in the width direction to be different from the second extent of the encroaching feature in the width direction.

13. A semiconductor device as recited in claim 9, wherein the given cell corresponds to a first cell, and wherein the semiconductor device further includes a second cell, wherein the second cell includes a second encroaching feature positioned to overlap a third segment of an outer cell boundary of the second cell, wherein the second encroaching feature of the second cell is shaped to align with the encroaching feature of the first cell when the third segment of the second cell outer boundary is aligned with the first segment of the first cell outer boundary, and wherein the encroaching feature of the first cell and the second encroaching feature of the second cell have a shared functionality such that a single instance of the encroaching feature within the semiconductor device provides the shared functionality for both the first and second cells when the third segment of the second cell outer boundary is aligned with the first segment of the first cell outer boundary.

14. A semiconductor device as recited in claim 1, wherein the semiconductor device includes both the given cell and a mirrored version of the given cell, wherein both the given cell and the mirrored version of the given cell each have a common centerline defined parallel to and equidistant between the first and second segments of the outer cell boundary, and wherein conductive features within the mirrored version of the given cell respectively correspond to conductive features within the given cell having been flipped about the common centerline.

15. A semiconductor device as recited in claim 1, wherein the exclusion distance is based on a design rule distance, wherein the design rule distance is a minimum separation distance required between conductive features in adjacently placed cells on the semiconductor device, wherein the design rule distance is within a range extending from about 30 nanometers to about 90 nanometers.

16. A semiconductor device as recited in claim 1, wherein the exclusion distance is based on a design rule distance, wherein the design rule distance is a minimum separation distance required between conductive features in adjacently placed cells on the semiconductor device, wherein the design rule distance is less than 70 nanometers.

17. A semiconductor device as recited in claim 1, wherein the exclusion distance is based on a design rule distance, wherein the design rule distance is a minimum separation distance required between conductive features in adjacently placed cells on the semiconductor device, wherein the exclusion distance is equal to one-half of the design rule distance.

\* \* \* \* \*